(12) United States Patent
Lee

(10) Patent No.: US 11,854,614 B2
(45) Date of Patent: *Dec. 26, 2023

(54) ELECTRONIC DEVICE AND MANUFACTURING METHOD OF ELECTRONIC DEVICE

(71) Applicant: SK hynix Inc., Icheon (KR)

(72) Inventor: Young Sam Lee, Icheon (KR)

(73) Assignee: SK hynix Inc., Icheon (KR)

( * ) Notice: Subject to any disclaimer, the term of this patent is extended or adjusted under 35 U.S.C. 154(b) by 280 days.

This patent is subject to a terminal disclaimer.

(21) Appl. No.: 17/315,194

(22) Filed: May 7, 2021

(65) Prior Publication Data
US 2021/0264977 A1    Aug. 26, 2021

Related U.S. Application Data

(63) Continuation of application No. 16/903,041, filed on Jun. 16, 2020, now Pat. No. 11,049,556.

(30) Foreign Application Priority Data

Oct. 21, 2019    (KR) .......................... 10-2019-0130959

(51) Int. Cl.
    *G11C 13/00*    (2006.01)
(52) U.S. Cl.
    CPC ...... *G11C 13/0028* (2013.01); *G11C 13/0026* (2013.01)

(58) Field of Classification Search
CPC ............ G11C 13/0028; G11C 13/0026; G11C 13/004; G11C 2213/77; H10B 63/30; H10N 70/821; H10N 70/011; H10N 70/841; H10N 50/85; H10N 70/021; H10N 70/061
See application file for complete search history.

(56) References Cited

U.S. PATENT DOCUMENTS

| 10,461,127 | B2* | 10/2019 | Park | H10N 70/8833 |
| 2005/0111247 | A1* | 5/2005 | Takaura | H10B 63/30 |
| | | | | 257/E27.004 |
| 2014/0030894 | A1* | 1/2014 | Shin | H01L 21/308 |
| | | | | 430/5 |
| 2018/0090512 | A1* | 3/2018 | Kim | H10B 43/40 |
| 2018/0175109 | A1* | 6/2018 | Choi | H10N 70/8828 |

FOREIGN PATENT DOCUMENTS

| KR | 10-2014-0016664 A | 2/2014 |
| KR | 10-2016-0020019 A | 2/2016 |
| KR | 10-2017-0097619 A | 8/2017 |

* cited by examiner

Primary Examiner — Khamdan N. Alrobaie

(57) ABSTRACT

An electronic device includes a semiconductor memory comprising column lines, row lines crossing the column lines, memory cells located at intersections between the column lines and the row lines, dummy insulating patterns located adjacent to the memory cells, liner layers formed on sidewalls of the memory cells, and dummy liner layers formed on sidewalls of the dummy insulating patterns.

15 Claims, 17 Drawing Sheets

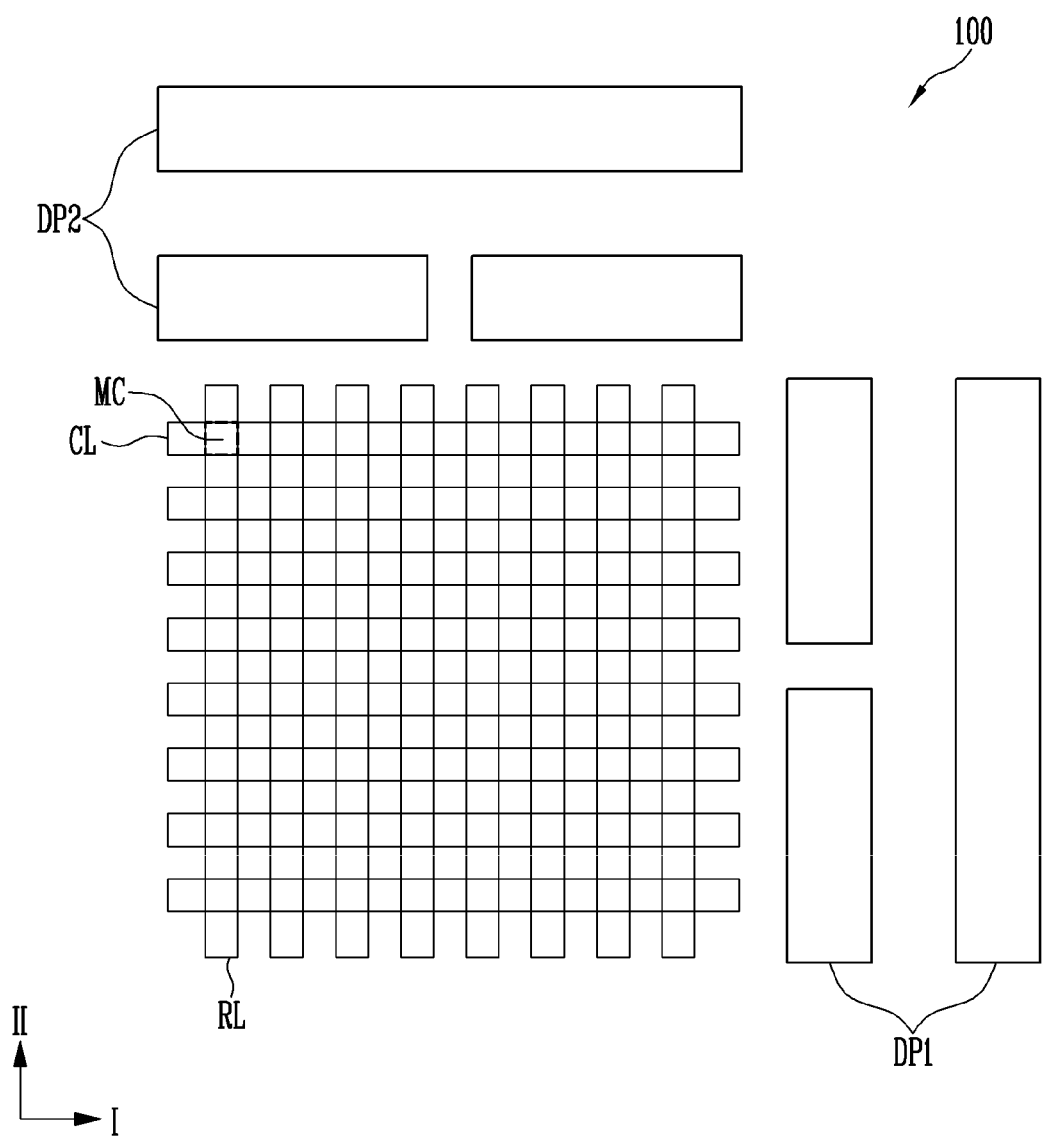

ELECTRONIC DEVICE AND MANUFACTURING METHOD OF ELECTRONIC DEVICE

CROSS-REFERENCE TO RELATED APPLICATION

The present application is a continuation of U.S. application Ser. No. 16/903,041 filed Jun. 16, 2020, claims priority under 35 U.S.C. § 119(a) to Korean patent application number 10-2019-0130959, filed on Oct. 21, 2019, which is incorporated herein by reference in its entirety.

BACKGROUND

Field of Invention

Various embodiments of the present disclosure generally relate to an electronic device, and more particularly, to an electronic device including a semiconductor memory and a method of manufacturing the electronic device.

Description of Related Art

Recently, with requirements of miniaturization, low power consumption, high performance, and diversification of electronic devices, semiconductor devices configured to store information are being required in various types of electronic devices such as computers and portable communication apparatuses. Therefore, there has been research on semiconductor devices configured to store data using characteristics of switching between different resistance states depending on a voltage or current being applied. Examples of such semiconductor devices may include a resistive random access memory (RRAM), a phase-change random access memory (PRAM), a ferroelectric random access memory (FRAM), a magnetic random access memory (MRAM), an E-fuse, and so forth.

SUMMARY

Various embodiments are directed to an electronic device capable of improving operating characteristics and reliability and a method of manufacturing the electronic device.

According to an embodiment, an electronic device may include a semiconductor memory comprising column lines, row lines crossing the column lines, memory cells located at intersections between the column lines and the row lines, dummy insulating patterns located adjacent to the memory cells, liner layers formed on sidewalls of the memory cells, and dummy liner layers formed on sidewalls of the dummy insulating patterns.

A method of manufacturing an electronic device including a semiconductor memory may include forming a cell stack in a cell region of a base, forming a first insulating layer in a peripheral region of the base, forming cell patterns by patterning the cell stack, forming first dummy insulating patterns by patterning the first insulating layer, forming liner layers on sidewalls of the cell patterns, and forming dummy liner layers on sidewalls of the first dummy insulating patterns.

BRIEF DESCRIPTION OF THE DRAWINGS

FIG. 1 is a diagram illustrating the structure of an electronic device according to an embodiment of the present disclosure;

DETAILED DESCRIPTION

Figure 2A:
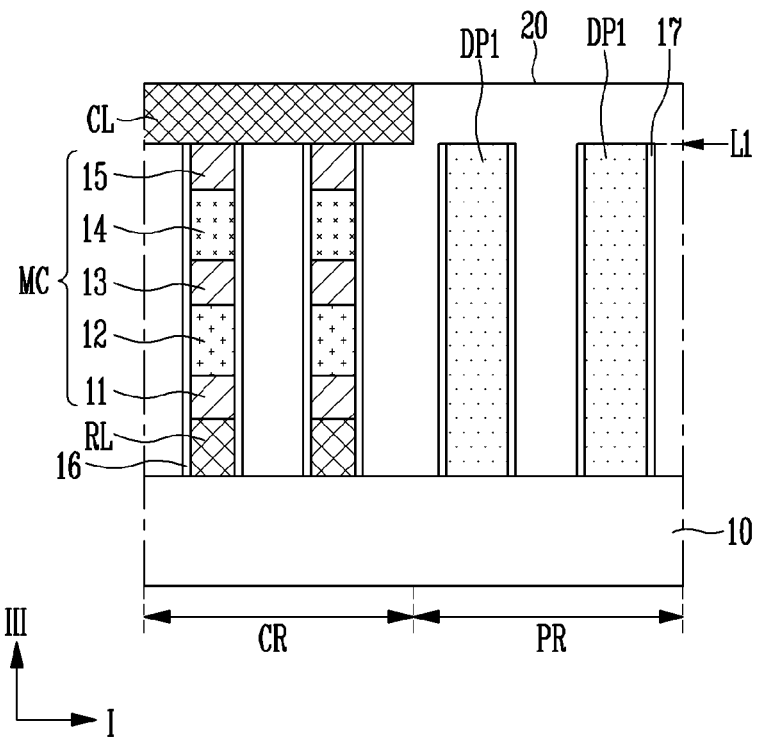
FIGS. 2A and 2B are diagrams illustrating the structure of an electronic device according to an embodiment of the present disclosure.

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

FIG. 1 illustrates the structure of an electronic device according to an embodiment of the present disclosure.

Referring to FIG. 1, an electronic device may include a semiconductor memory. The semiconductor memory may be a non-volatile memory device and a variable resistance memory device.

The semiconductor memory may include row lines RL and column lines CL crossing the row lines RL. The row lines RL may extend in parallel in a second direction II. The column lines CL may extend in a first direction I crossing the second direction II. The row lines RL may be word lines and the column lines CL may be bit lines. However, the word lines and the bit lines may serve different purposes in other embodiments. For example, the row lines RL may be bit lines and the column lines CL may be word lines.

A cell array 100 may include memory cells MC arranged between the column lines CL and the row lines RL. The memory cells MC may be arranged at intersections between the column lines CL and the row lines RL. Each of the memory cells MC may include a select element or a memory element. A memory element may be a storage node for storing data and may include a variable resistance material. A select element may be for selecting the memory cells MC and may include a switching material. The shape and configuration of each of the memory cells MC may be variously modified. For example, in some embodiments the select element or the memory element may be omitted.

The electronic device may further include dummy insulating patterns. The dummy insulating patterns may be located at an outer edge of the cell array 100, or a peripheral region where peripheral circuits are located. The dummy insulating patterns may include at least one first dummy insulating pattern DP1, at least one second dummy insulating pattern DP2, or both first and second dummy insulating patterns DP1 and DP2.

The first dummy insulating patterns DP1 may be disposed adjacent to the memory cells MC, the row lines RL and the column lines CL in the first direction I. The first dummy insulating patterns DP1 may have a line shape or an island shape in a plane view. When the first dummy insulating patterns DP1 have a line shape, the first dummy insulating patterns DP1 may extend in parallel with the row lines RL and extend in the second direction II. When the first dummy insulating patterns DP1 have an island-shaped plane, the first dummy insulating patterns DP1 may be arranged adjacent to each other in the first direction I and/or the second direction II.

Each of the first dummy insulating patterns DP1 may have a length in the second direction II and a width in the first direction I. The first dummy insulating patterns DP1 may have a greater width than the row lines RL. When row lines RL have varying widths, a width of the first dummy insulating patterns DP1 may be greater than the greatest width of the row lines RL. The first dummy insulating patterns DP1 may have substantially the same depth or different depths. In addition, the first dummy insulating patterns DP1 may have substantially the same width or different widths. Substantially the same may refer to deviations from nominal that are typical in a manufacturing environment.

The second dummy insulating patterns DP2 may be disposed adjacent to the memory cells MC, the row lines RL and the column lines CL in the second direction II. The second dummy insulating patterns DP2 may have a line shape or an island shape in a plane view. When the second dummy insulating patterns DP2 have a line-shaped plane, the second dummy insulating patterns DP2 may extend in parallel with the column lines CL and extend in the first direction I. When the second dummy insulating patterns DP2 have an island shape, the second dummy insulating patterns DP2 may be arranged adjacent to each other in the first direction I and/or the second direction II.

Each of the second dummy insulating patterns DP2 may have a length in the first direction I and a width in the second direction II. The second dummy insulating patterns DP2 may have a greater width than the column lines CL. When column lines CL have varying widths, a width of the second dummy insulating patterns DP2 may be greater than the greatest width of the column lines CL. The second dummy insulating patterns DP2 may have substantially the same depth or different depths. In addition, the second dummy insulating patterns DP2 may have substantially the same width or different widths.

Figure 2B:
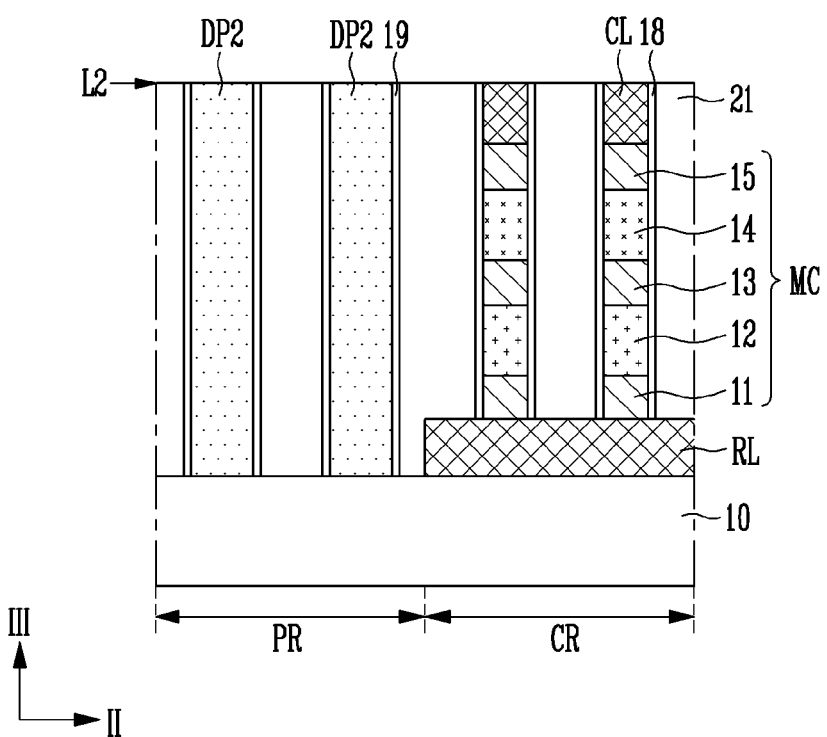

FIGS. 2A and 2B are diagrams illustrating the structure of an electronic device according to an embodiment of the present disclosure. FIG. 2A is a cross-sectional diagram of the cell array 100 of FIG. 1 in the first direction I. FIG. 2B is a cross-sectional diagram of the cell array 100 of FIG. 1 in the second direction II.

Referring to FIGS. 2A and 2B, according to an embodiment of the present disclosure, an electronic device may include the row lines RL, the memory cells MC, the column lines CL, the first and second dummy insulating patterns DP1 and DP2, first liner layers 16, second liner layers 18, first dummy liner layers 17, and second dummy liner layers 19. The electronic device may further include a base 10 and insulating layers 20 and 21. The base 10 may be a semiconductor substrate.

The base 10 may include a cell region CR and a peripheral region PR. A cell array may be located in the cell region CR. A peripheral circuit for driving the cell array may be located in the peripheral region PR. The row lines RL, the memory cells MC, the column lines CL, the first liner layers 16 and the second liner layers 18 may be located in the cell region CR. In addition, the first dummy insulating patterns DP1, the second dummy insulating patterns DP2, the first dummy liner layers 17 and the second dummy liner layers 19 may be located in the peripheral region PR.

Each of the memory cells MC may include a first electrode 11, a switching layer 12, a second electrode 13, a variable resistance layer 14 and a third electrode 15. The positions of the switching layer 12 and the variable resistance layer 14 may be reversed in some embodiments. For example, the positions of the switching layer 12 and the variable resistance layer 14 may be reversed relative to the configuration shown in FIGS. 2A and 2B.

The variable resistance layer 14 may reversibly transition between different resistance states depending on a voltage or current being applied. Therefore, when the variable resistance layer 14 has a low resistance state, data of '1' may be stored. On the other hand, when the variable resistance layer 14 has a high resistance state, data of '0' may be stored.

When the variable resistance layer 14 includes a resistance material, the variable resistance layer 14 may include a transition metal oxide, or a metal oxide such as a perovskite-based material. Therefore, as an electrical path is generated or removed in the variable resistance layer 14, data may be stored.

When the variable resistance layer 14 has a Magnetic Tunnel Junction (MTJ) structure, the variable resistance layer 14 may include a magnetization fixed layer, a magnetization free layer, and a tunnel barrier layer interposed therebetween. For example, the magnetization fixed layer and the magnetization free layer may include a magnetic material, and the tunnel barrier layer may include an oxide such as magnesium (Mg), aluminum (Al), zinc (Zn), or titanium (Ti). A magnetization direction of the magnetization free layer may be changed by spin torque of electrons in applied current. Therefore, data may be stored depending on changes in magnetization direction of the magnetization free layer with respect to the magnetization direction of the magnetization fixed layer.

When the variable resistance layer 14 includes a phase change material, the variable resistance layer 14 may include a chalcogenide-based material. The variable resistance layer 14 may include silicon (Si), germanium (Ge), antimony (b), tellurium (Te), bismuth (Bi), indium (In), tin (Sn), selenium (Se), or a combination thereof as the chalcogenide-based material. For example, the variable resistance layer 14 may be a Ge—Sb—Te (GST) material such as $Ge_2Sb_2Te_5$, $Ge_2Sb_2Te_7$, $Ge_1Sb_2Te_4$, or $Ge_1Sb_4Te_7$. A chemical composition ratio of the variable resistance layer 14 may be established depending on melting point and crystallization temperature characteristics. The variable resistance layer 14 may further include carbon (C) or nitrogen (N) impurities. The phase change material may have low-resistance characteristics when in a crystalline state and high-resistance characteristics when in an amorphous state. Therefore, data may be stored according to a set operation in which a high resistance amorphous state is switched to a low resistance crystalline state, and a reset operation in which a low resistance crystalline state is switched to a high resistance amorphous state.

The switching layer 12 may be a select element that controls a flow of current according to an amount of applied voltage or current. A small amount of current may flow through the switching layer 12 when the magnitude of the applied voltage or current is less than a threshold value, and a much larger amount of current may flow when the applied voltage or current exceeds the threshold value.

When the switching layer 12 is a metal insulator transition (MIT) device, the switching layer 12 may include $VO_2$, $NbO_2$, $TiO_2$, $WO_2$, $TiO_2$, or the like. When the switching layer is a mixed ion-electron conducting (MIEC) device, the switching layer 12 may include $ZrO_2(Y_2O_3)$, $Bi_2O_3$—BaO, $(La_2O_3)x(CeO_2)_{1-x}$, or the like. In addition, when the switching layer 12 is an ovonic threshold switching (OTS) device, the switching layer 12 may include Te, Se, Ge, Si, As, Ti, S, Sb, or the like. For example, the switching layer 12 may include a chalcogenide-based material such as AsTe, AsSe, AsTeSe, AsTeGe, AsSeGe, and AsTeGeSe.

The first electrode 11 may be electrically coupled to the row lines RL, the second electrode 13 may be interposed between the switching layer 12 and the variable resistance layer 14, and the third electrode 15 may be electrically coupled to the column lines CL. The first electrode 11, the second electrode 13 and the third electrode 15 may include a conductive material such as metal or metallic nitrides. For example, each of the first electrode 11, the second electrode and the third electrode 15 may include tungsten (W), tungsten nitride (WN), tungsten silicide (WSi), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), cobalt (Co), lead (Pd), platinum (Pt), or a combination thereof.

The first liner layer 16 and the second liner layer 18 may be provided to protect the stacked layers of the memory cell MC during manufacturing processes. The first liner layer 16 may be formed to cover sidewalls of the memory cell MC that face each other in the first direction I. The first liner layer 16 may extend in the second direction II. The second liner layer 18 may be formed to surround the sidewalls of the memory cell MC which face each other in the second direction II, and may extend in the first direction I. The first liner layer 16 and the second liner layer 18 may be formed on the entirety or a portion of the sidewalls of the memory cell MC. The first liner layer 16 may extend to a sidewall of the row line RL and the second liner layer 18 may extend to a sidewall of the column line CL.

The first liner layer 16 and the second liner layer 18 may include a non-conductive material and include nitrides, oxides, and the like. For example, the first liner layer 16 and the second liner layer 18 may include silicon oxide ($SiO_x$), silicon nitride ($Si_3N_4$), polysilicon, titanium nitride (TiN), tantalum nitride (TaN), or a combination thereof. In addition, each of the first liner layer 16 and the second liner layer 18 may be a single material layer or a multilayer film.

The first dummy insulating pattern DP1 may be disposed adjacent to the memory cells MC, the row lines RL and the column lines CL in the first direction I. An upper surface of the first dummy insulating pattern DP1 may be located at substantially the same level L1 as an upper surface of the memory cell MC. For example, the upper surface of the third electrode 15 and the upper surface of the first dummy insulating pattern DP1 may be located at substantially the same level L1. Alternately, the upper surface of the first dummy insulating pattern DP1 may be located at a lower level than the upper surface of the third electrode 15.

The second dummy insulating pattern DP2 may be disposed adjacent to the memory cells MC, the row lines RL and the column lines CL in the second direction II. The upper surface of the second dummy insulating pattern DP2 may be located at substantially the same level L2 as the upper surface of the column line CL. In addition, the second dummy insulating pattern DP2 may have a different depth from the first dummy insulating pattern DP1. Accordingly, the upper surface of the second dummy insulating pattern DP2 may be located at a higher level than the upper surface of the first dummy insulating pattern DP1 (L2>L1).

Each of the first and second dummy insulating patterns DP1 and DP2 may have a single layer of material. In addition, each of the first and second dummy insulating patterns DP1 and DP2 may include a single material. For example, each of the first and second dummy insulating patterns DP1 and DP2 may be an oxide material layer or a nitride material layer.

The first dummy liner layer 17 may be formed on sidewalls of the first dummy insulating pattern DP1. In addition, the first dummy liner layer 17 may cover both sidewalls of the first dummy insulating pattern DP1 that face each other in the first direction I. The first dummy liner layer 17 may extend in the second direction II. The second dummy liner layer 19 may cover both sidewalls of the second dummy insulating pattern DP2 that face each other in the second direction II. The second dummy liner layer 19 may extend in the first direction I. The first dummy liner layer 17 may be formed on the entirety or a portion of the sidewall of the first dummy insulating pattern DP1. The second dummy liner layer 19 may be formed on the entirety or a portion of the sidewalls of the second dummy insulating pattern DP2.

The first dummy liner layer 17 and the second dummy liner layer 19 may include a non-conductive material and include nitrides, oxides, and the like. For example, the first dummy liner layer 17 and the second dummy liner layer 19 may include silicon oxide ($SiO_x$), silicon nitride ($Si_3N_4$), polysilicon, titanium nitride (TiN), tantalum nitride (TaN), or a combination thereof. In addition, each of the first dummy liner layer 17 and the second dummy liner layer 19 may be a single material layer or a multilayer film.

The first dummy liner layer 17 may be formed when the first liner layer 16 is formed. Therefore, the structure and material of the first dummy liner layer 17 may correspond to those of the first liner layer 16. The second dummy liner layer 19 may be formed when the second liner layer 18 is formed. Therefore, the structure and material of the second dummy liner layer 19 may correspond to those of the second liner layer 18.

The first insulating layer 20 and the second insulating layer 21 may be formed to fill spaces between neighboring memory cells MC. The first insulating layer 20 may fill a space between neighboring memory cells MC in the first direction I and spaces between neighboring row lines RL in the first direction I. The second insulating layer 21 may fill spaces between neighboring memory cells MC in the second direction II and spaces between neighboring column lines CL in the second direction II. The first insulating layer 20 and the second insulating layer 21 may include a flowable oxide layer such as a spin on coating (SOC) layer or a spin on dielectric (SOD) layer, an oxide, such as a silicon oxide ($SiO_2$), or a combination thereof.

FIGS. 3A to 12A and FIGS. 3B to 12B are diagrams illustrating a method of manufacturing an electronic device according to an embodiment of the present disclosure. FIGS. 3A to 12A are plan views and FIGS. 3B to 12B are cross-sectional views.

Figure 3A:
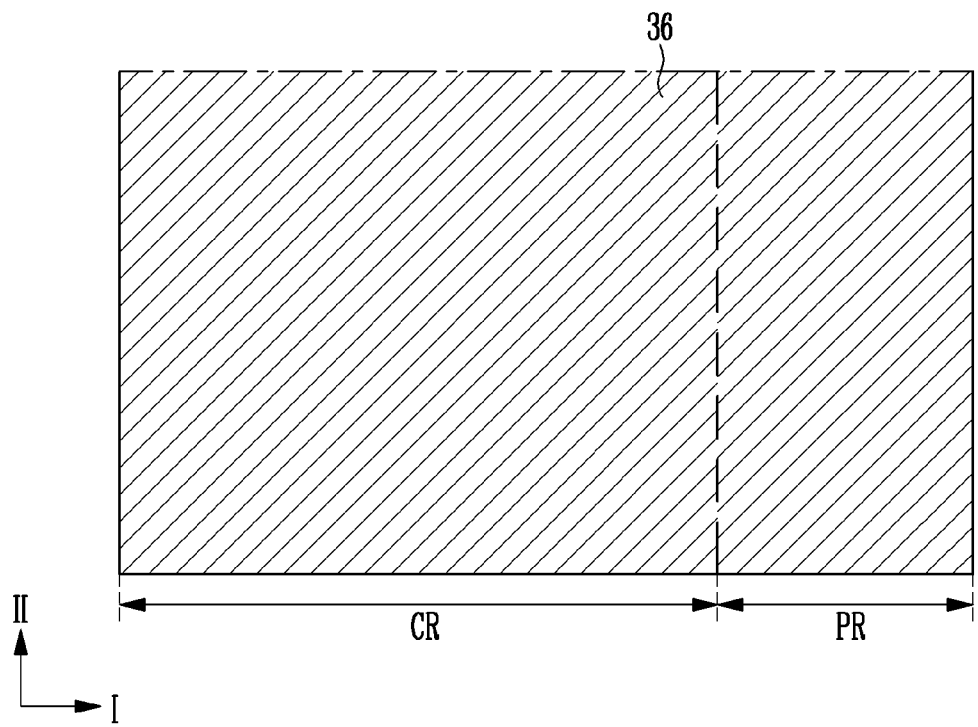
FIGS. 3A, 3B, 4A, 4B, 5A, 5B, 6A, 6B, 7A, 7B, 8A, 8B, 9A, 9B, 10A, 10B, 11A, 11B, 12A, 12B, and FIG. 13 are diagrams illustrating a method of manufacturing an electronic device according to an embodiment of the present disclosure.
Figure 3B:
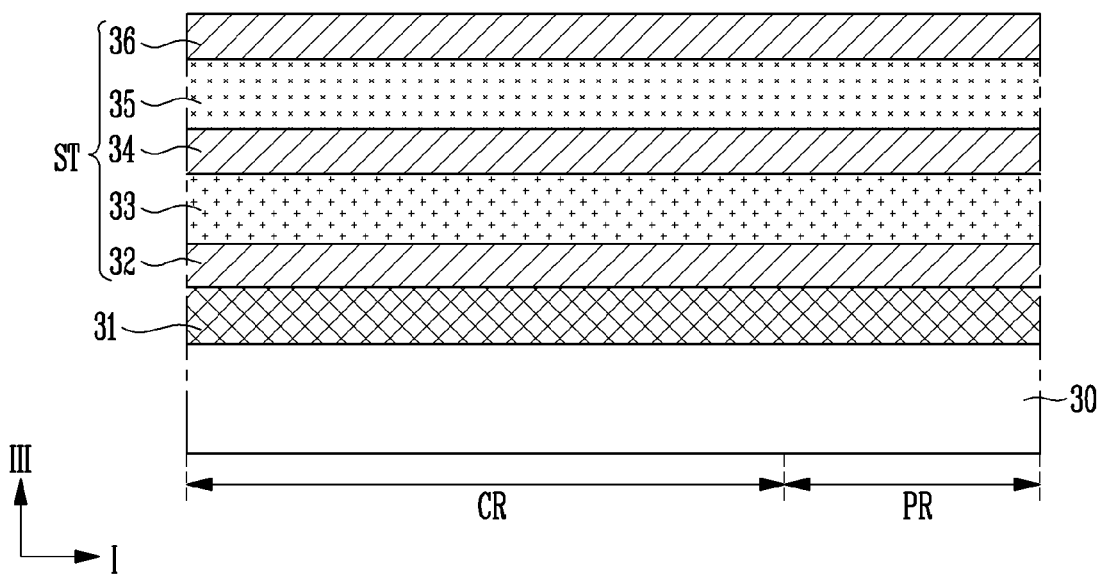

Referring to FIGS. 3A and 3B, a first conductive material 31 may be formed on a base 30. The base 30 may include a semiconductor substrate. The base 30 may include the cell region CR and the peripheral region PR. The first conductive material 31 may be provided to form a row line and include metal such as tungsten.

A stacked structure ST may be formed on the first conductive material 31. The stacked structure ST may be formed on the cell region CR of the base 30, or on both the cell region CR and the peripheral region PR of the base 30. The stacked structure ST may include multiple layers stacked in a third direction III. The stacked structure ST may include at least one of a first electrode material 32, a switching material 33, a second electrode material 34, a variable resistance material 35, and a third electrode material 36. The third direction III may cross the first direction I and the second direction II. For example, the third direction III may be orthogonal to the plane defined by the first direction I and the second direction II, and may be a depth direction of the device.

Figure 4A:
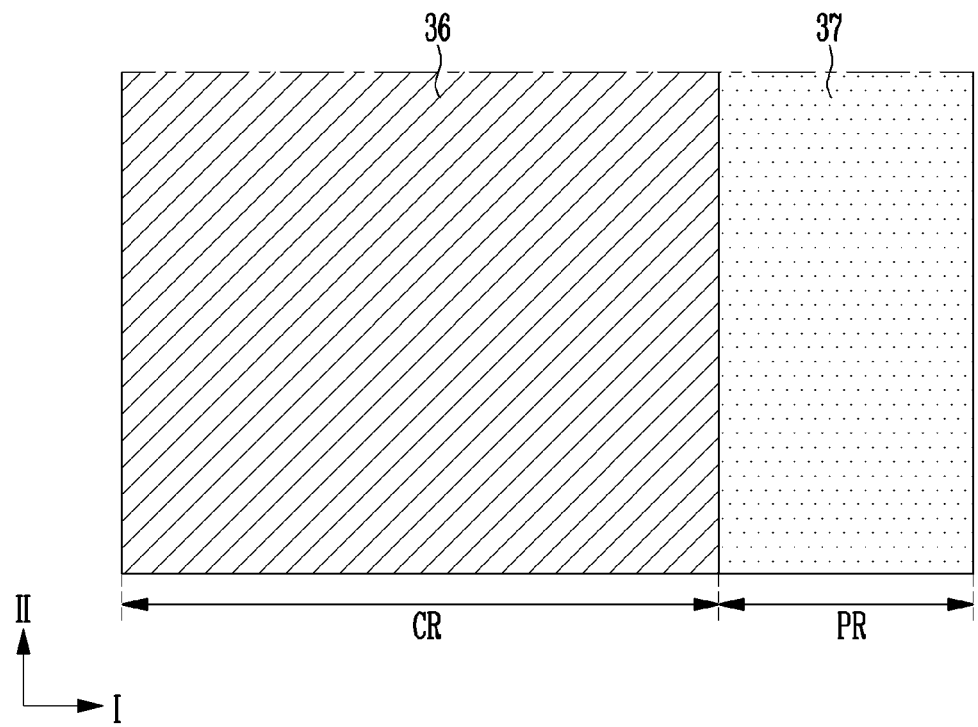
Figure 4B:
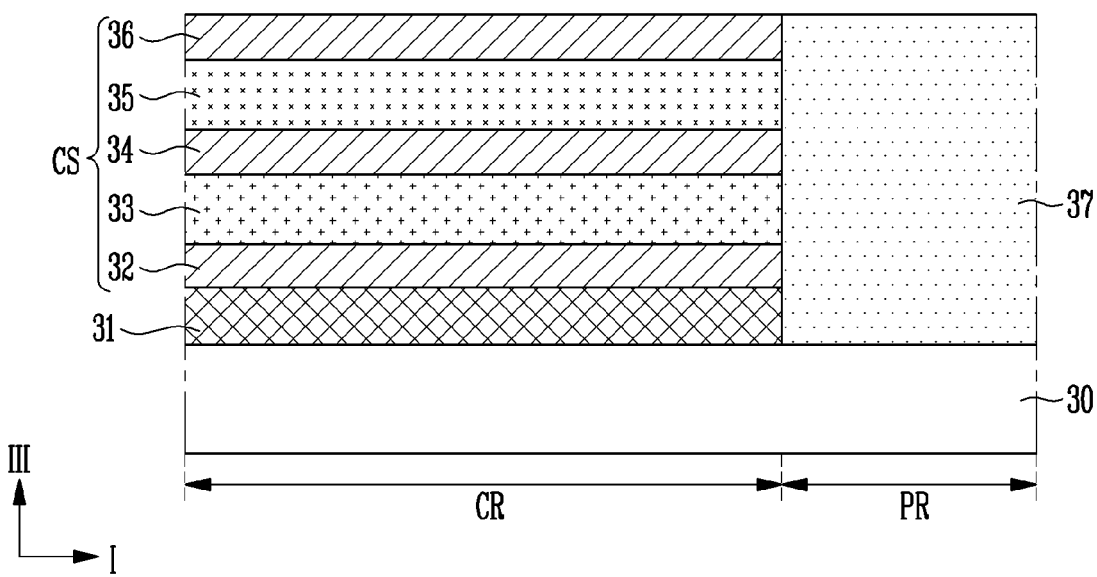

Referring to FIGS. 4A and 4B, a cell stack CS may be formed. The cell stack CS may be formed by etching a portion of the stacked structure ST corresponding to the peripheral region PR. Subsequently, a portion of the first conductive material 31 corresponding to the peripheral region PR may be etched to expose the base 30.

An insulating layer 37 may be formed on the peripheral region PR of the base 30. In an embodiment, after an insulating material is formed on the cell stack CS and the base 30, the insulating material may be etched until an upper surface of the cell stack CS is exposed, thereby forming the insulating layer 37. The insulating layer 37 may include an oxide layer.

Referring to FIGS. 5A, 5B, 6A and 6B, first and second mask patterns 38A and 38B may be formed on the cell stack CS and the insulating layer 37. The first mask pattern 38A may be formed on the cell stack CS and the second mask pattern 38B may be formed on the insulating layer 37. In an embodiment, the second mask pattern 38B may be formed after the first mask pattern 38A is formed. However, in another embodiment, the first mask pattern 38A may be formed after the second mask pattern 38B is formed. The following disclosure describes an embodiment of a method of forming the second mask pattern 38B after the first mask pattern 38A is formed.

Figure 5A:
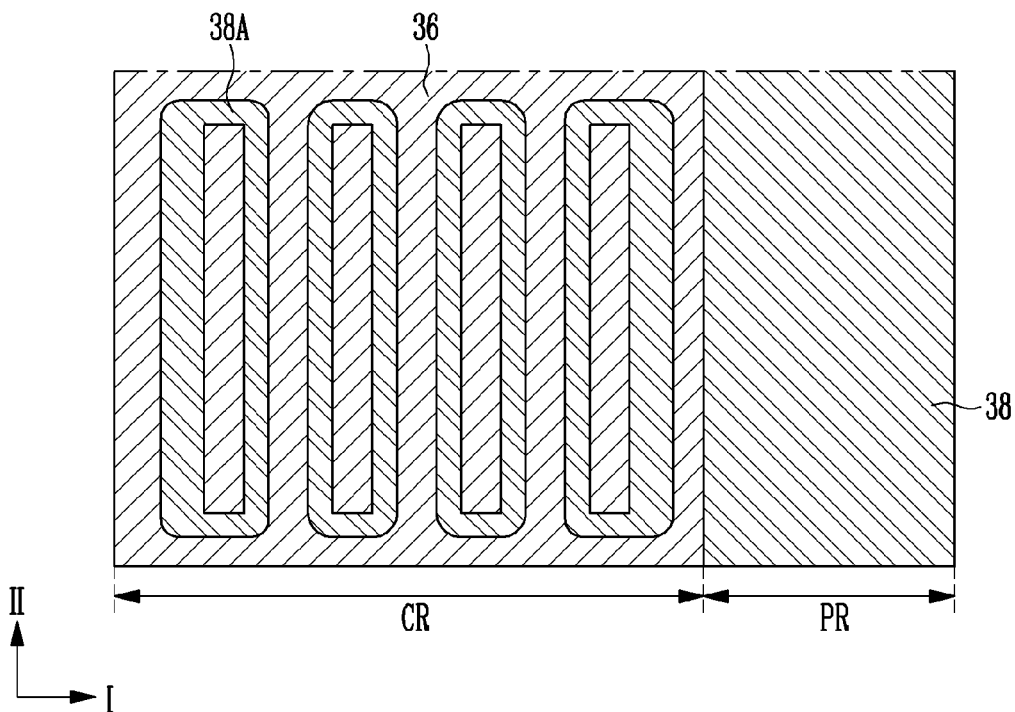
Figure 5B:
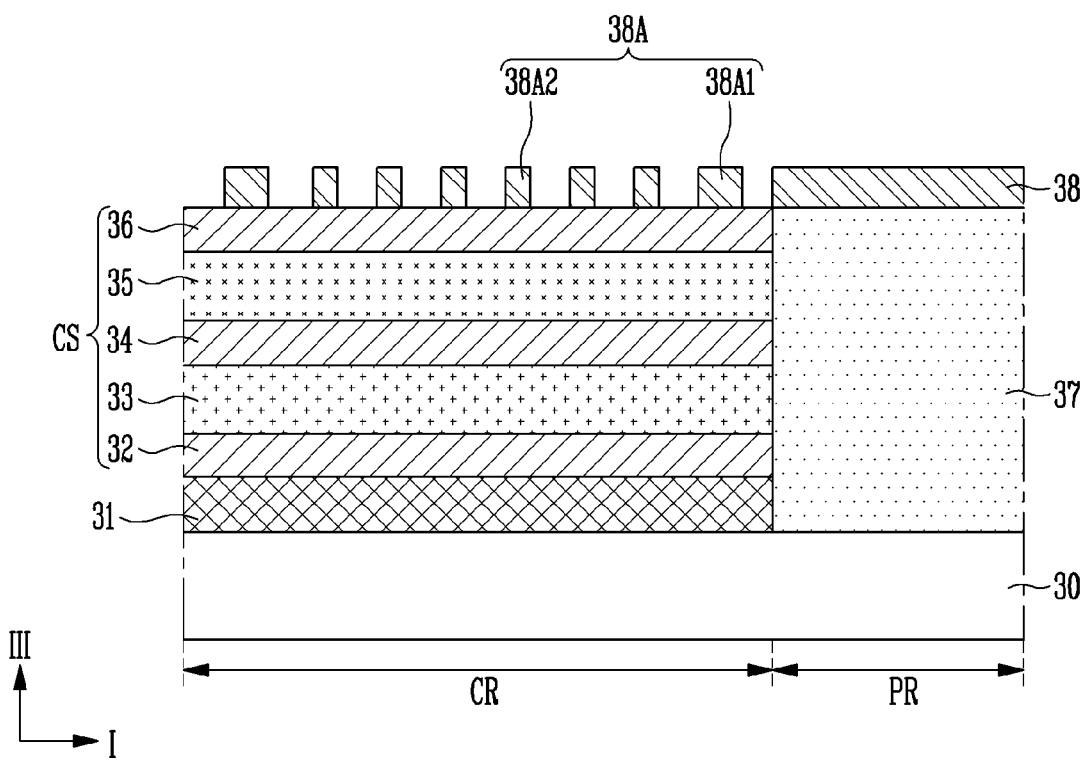

Referring to FIGS. 5A and 5B, the first mask pattern 38A may be formed using a spacer patterning technology (SPT). First, a hard mask layer 38 may be formed on the cell stack CS and a sacrificial pattern (not shown) may be formed on the hard mask layer 38. A spacer having a loop shape may then be formed on a sidewall of the sacrificial pattern. Next, the sacrificial pattern may be removed. Subsequently, the hard mask layer 38 may be etched using a spacer as an etch barrier to form the first mask pattern 38A. As a result, the first mask pattern 38A having a narrower pitch than the resolution of exposure equipment may be formed.

The first mask pattern 38A may include patterns having a loop shape. The loop shape may be an elongated and enclosed loop having a long axis that is oriented in direction II as shown in FIG. 5A. The patterns may have a constant or varying width. Some of the patterns may have a greater width than other patterns, or a portion of a pattern may have a greater width than the remaining portions of the pattern. For example, a portion 38A1 of the first mask pattern 38A which is located at an edge of the cell region CR may have a greater width than a portion 38A2 located at the center of the cell region CR.

Figure 6A:
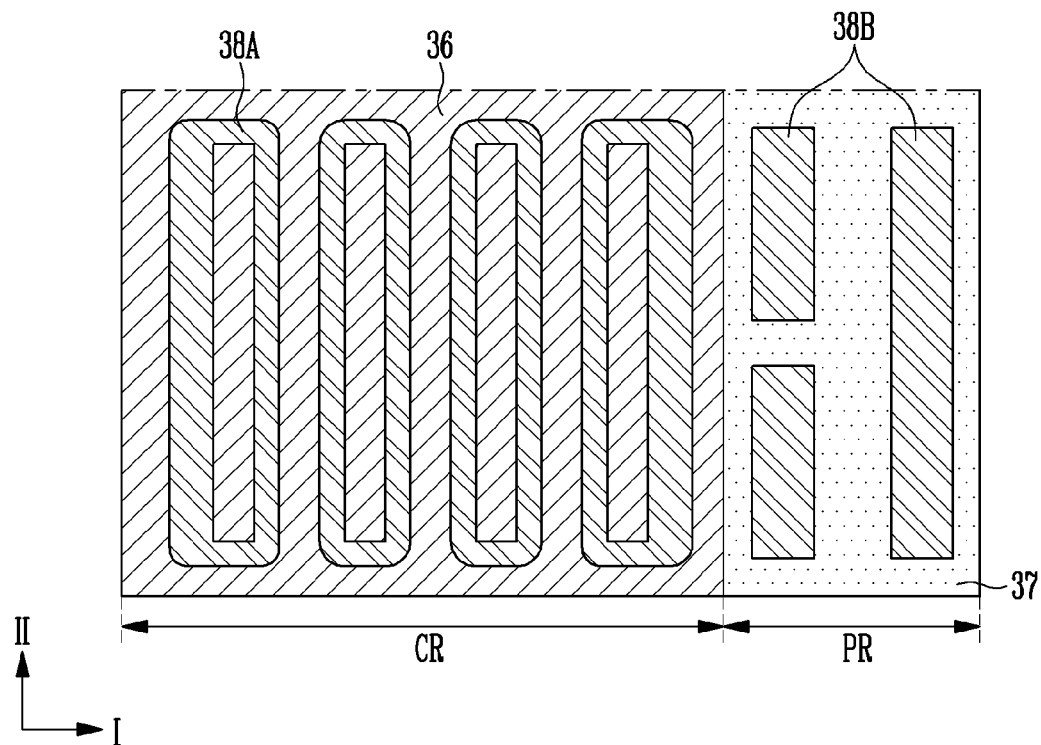
Figure 6B:
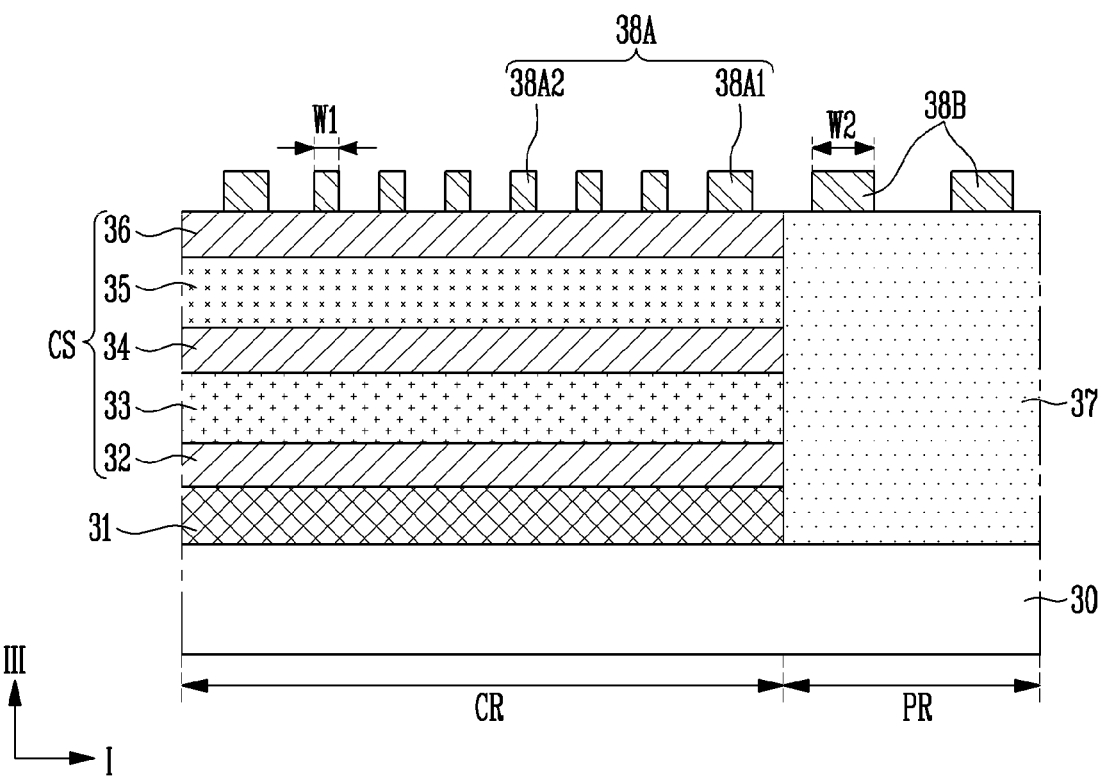

Referring to FIGS. 6A and 6B, the portion of the hard mask layer 38 in the peripheral region PR may be patterned to form the second mask pattern 38B. First, after a photoresist pattern is formed on the hard mask layer 38, the hard mask layer 38 may be etched using the photoresist pattern as an etch barrier to form the second mask pattern 38B. The second mask pattern 38B may be formed by a general patterning process rather than using SPT. In addition, when the second mask pattern 38B is formed, a cell closed mask may be used so as not to expose the cell region CR in which the first mask pattern 38A is previously formed. The second mask pattern 38B may have a greater width than the first mask pattern 38A (W2>W1).

The second mask pattern 38B may have patterns with a line shape. Each of the patterns may extend in the second direction II and have a length in the second direction II and a width in the first direction I. The patterns may have the same or different lengths from one another.

Figure 7A:
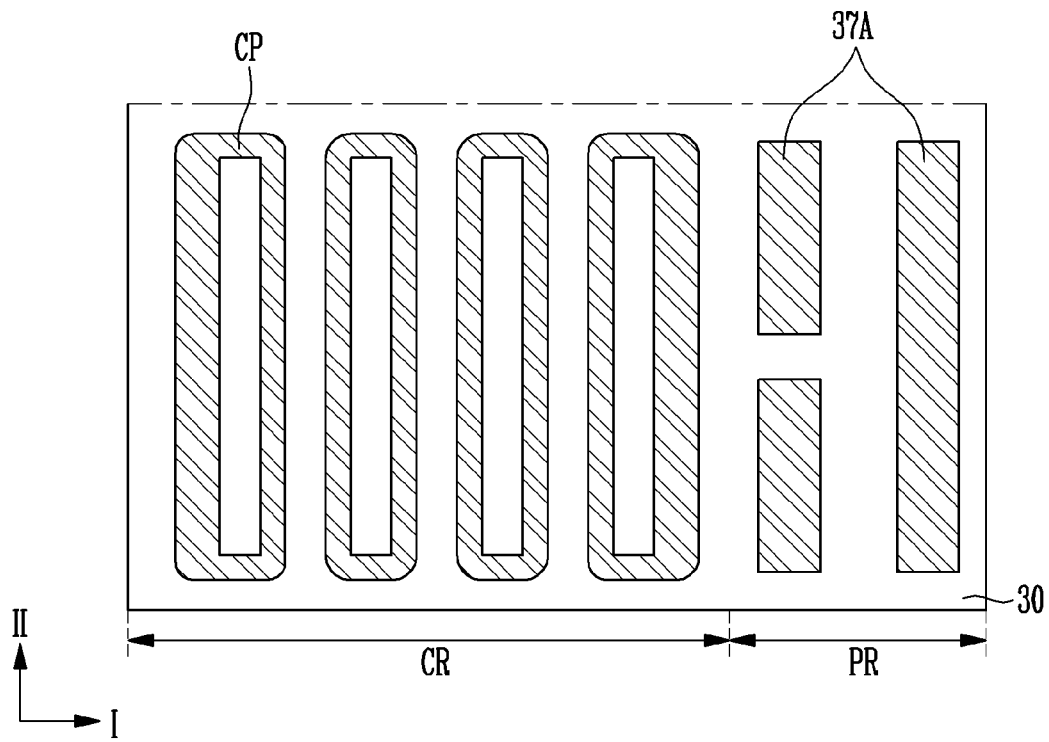
Figure 7B:
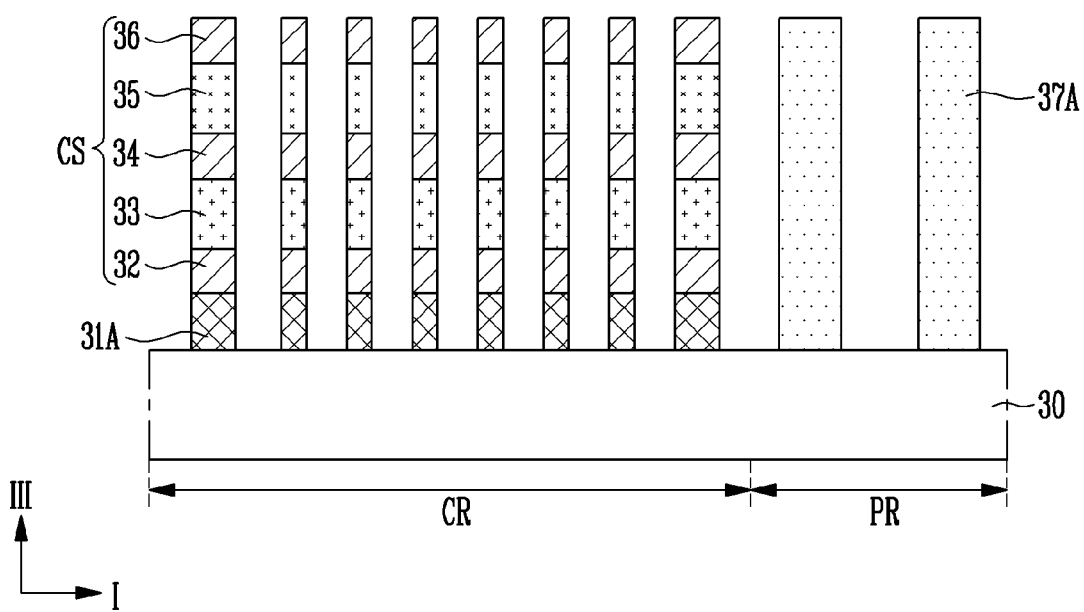

Referring to FIGS. 7A and 7B, cell patterns CP, row lines 31A and first dummy insulating patterns 37A may be formed. The cell stack CS may be etched using the first mask pattern 38A as an etch barrier to form the cell patterns CP. Subsequently, the row lines 31A may be formed by etching the first conductive material 31.

In addition, the first dummy insulating patterns 37A may be formed by etching the insulating layer 37 using the second mask pattern 38B as an etch barrier. The first dummy insulating patterns 37A may be formed when the cell patterns CP and the row lines 31A are formed. Upper surfaces of the cell patterns CP and upper surfaces of the first dummy insulating patterns 37A may be located at substantially the same level.

The shape of the cell patterns CP may correspond to the shape of the first mask pattern 38A. Each of the cell patterns CP may have a loop shape. The cell patterns CP that are located at edges of the cell region CR may have a greater width than the cell patterns CP located at the center of the cell region CR. The shape of the row lines 31A may correspond to the shape of the cell patterns CP. Each of the row lines 31A may have a loop shape, and row lines located at the edges of the cell region CR may have a greater width than row lines located at the center of the cell region CR.

The shape of the first dummy insulating patterns 37A may correspond to the shape of the second mask pattern 38B. The first dummy insulating patterns 37A may extend in parallel with the row lines 31A and extend in the second direction II.

Figure 8A:
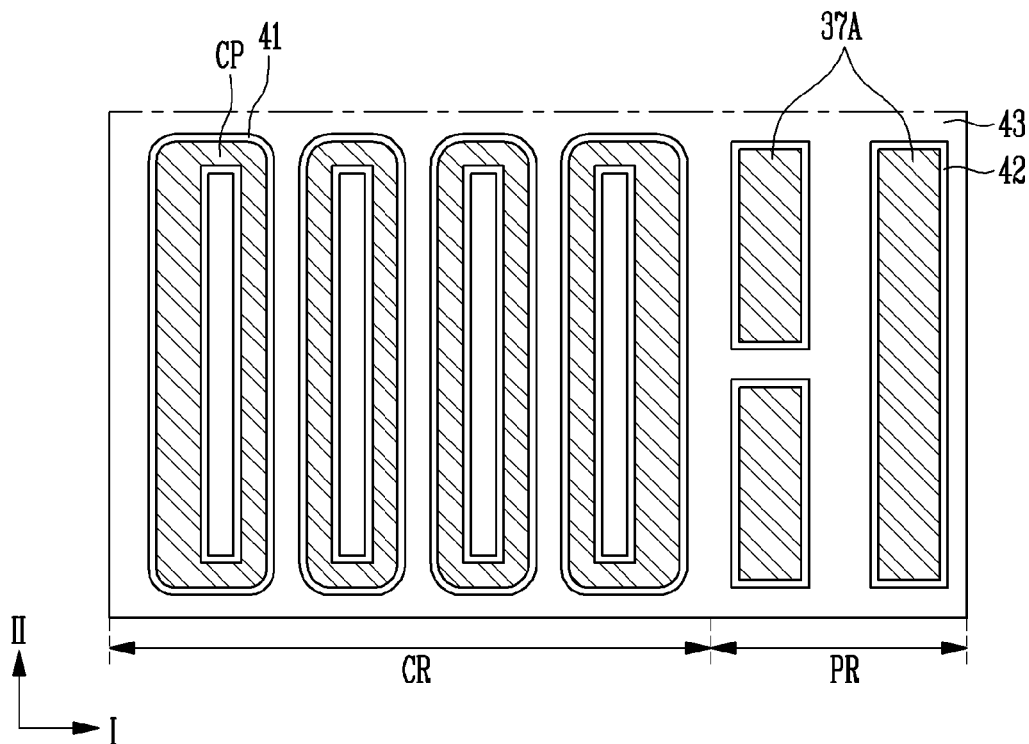
Figure 8B:
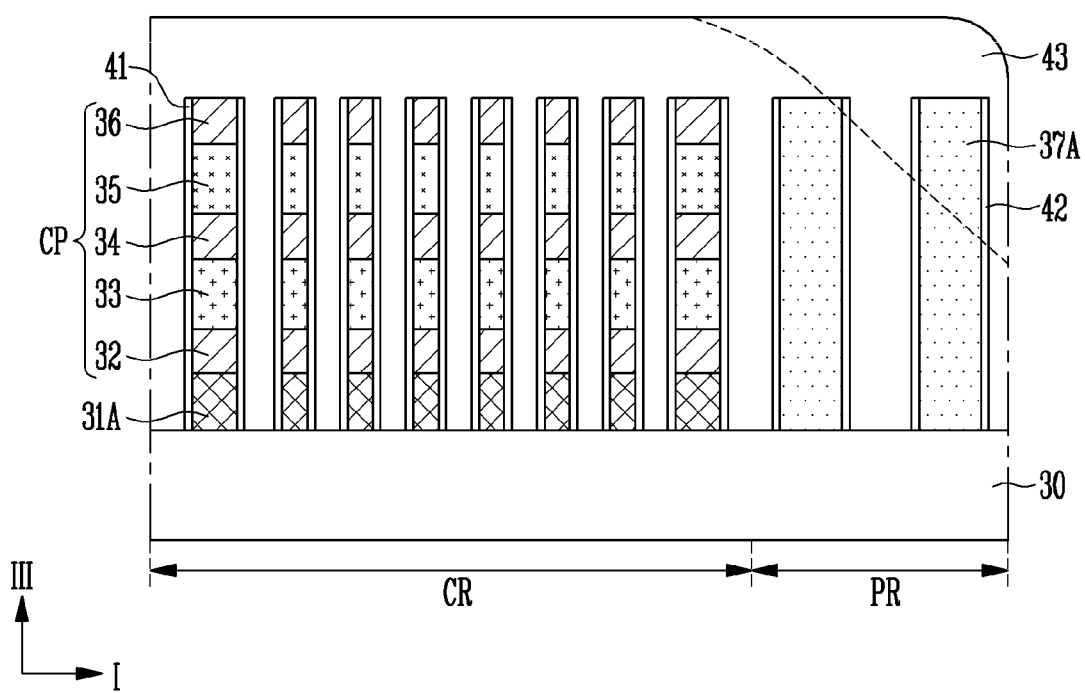

The length, width, distance, shape, number and pattern density of the first dummy insulating patterns 37A may be determined in consideration of an insulating material 43 forming processes with reference to FIGS. 8A and 8B. For example, when the insulating material 43 is coated using a spin-on process, the shape of the insulating material coating may vary depending on the centrifugal force generated during coating and the surface tension of the insulating material. In addition, the pattern density of the first dummy insulating patterns 37A may affect how the insulating material 43 interacts with the patterns based on the surface tension of the insulating material 43. When spacing between the first dummy insulating patterns 37A is greater than or equal to a threshold value, the effects of surface tension may be reduced and the effects of centrifugal force may become greater than the effects of surface tension. As a result, the insulating material may not be uniformly coated. Therefore, the pattern density of the first dummy insulating patterns 37A may be controlled to provide a balance between centrifugal force and surface tension that results in an even coating.

Referring to FIGS. 8A and 8B, first liner layers 41 and first dummy liner layers 42 may be formed. The first liner layers 41 may be formed on sidewalls of the cell patterns CP.

The first liner layers 41 may be formed on the entirety or a portion of the sidewalls of the cell patterns CP. The first liner layers 41 may extend to the sidewalls of the row lines 31A. The first dummy liner layers 42 may be formed on the sidewalls of the first dummy insulating patterns 37A. The first dummy liner layers 42 may be formed on the entirety or a portion of the sidewalls of the first dummy insulating pattern 37A.

The first dummy liner layers 42 may be formed when the first liner layers 41 are formed. Therefore, the structure and material of the first dummy liner layers 42 may be substantially the same as those of the first liner layers 41. The first liner layers 41 and the first dummy liner layers 42 may be formed using a deposition process and be formed over the cell patterns CP and the first dummy insulating patterns 37A so that the coating conforms to the profile of the cell patterns CP and the first dummy insulating patterns 37A. The first liner layers 41 and the first dummy liner layers 42 may include a non-conductive material and may include nitrides, oxides, and the like. In an embodiment, portions of the first liner layers 41 disposed over top surfaces of the cell patterns CP may be removed using a polishing or etching process.

Subsequently, an insulating material 43 may be formed. The insulating material 43 may be formed to fill spaces between the cell patterns CP, spaces between the row lines 31A and spaces between the first dummy insulating patterns 37A. The insulating material 43 may include a low-k material. The insulating material 43 may be formed using a deposition process, or may be coated using a spin-on process.

When the first dummy insulating patterns 37A are not present, the peripheral region PR may not receive a sufficiently thick coating of the insulating material 43. When first dummy insulating patterns 37A are not present in the peripheral region PR, the height of the insulating material 43 in the peripheral region PR may be substantially lower than the height of the insulating material 43 in cell patterns CP as indicated by the dashed line in FIG. 8B). On the other hand, when the first dummy insulating patterns 37A having substantially the same or similar height to the cell patterns CP are formed in the peripheral region PR, the level difference between the cell region CR and the peripheral region PR may be reduced. The spaces between the first dummy insulating patterns 37A may be filled with the insulating material 43. In addition, the volume occupied by the dummy insulating patterns 37A may displace the insulating material to even out the thickness of insulating material 43 between the cell region CR and the peripheral region PR. Accordingly, embodiments of the present disclosure may provide the insulating material 43 with minimal height variations between the cell region CR and the peripheral region PR.

Figure 9A:
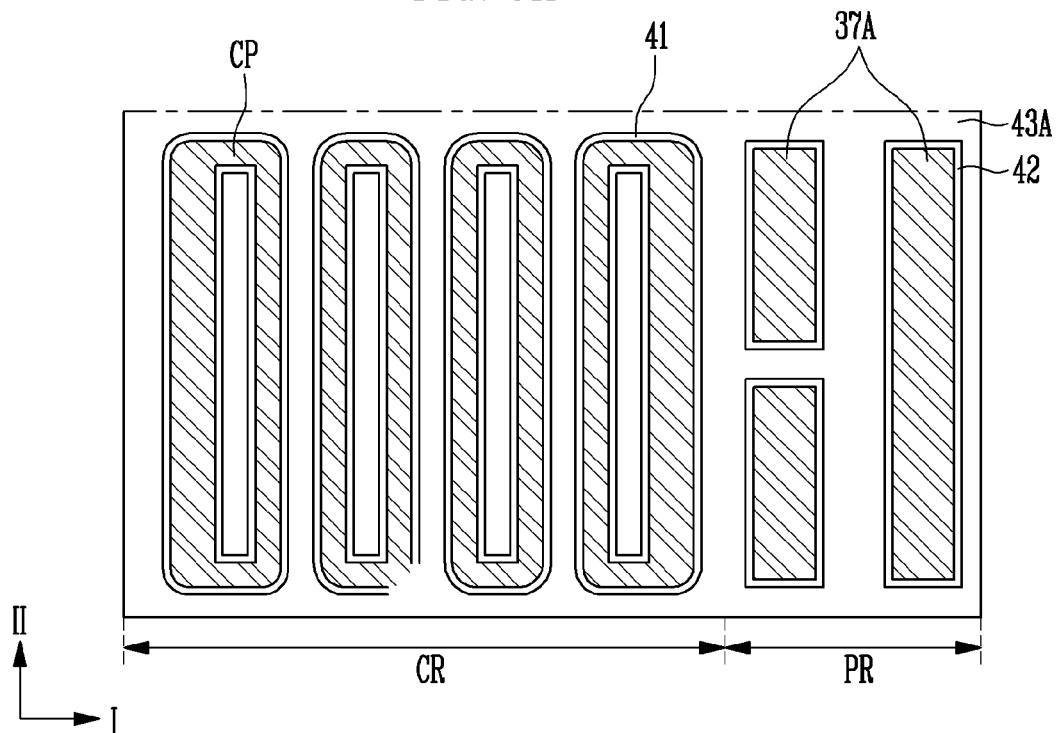
Figure 9B:
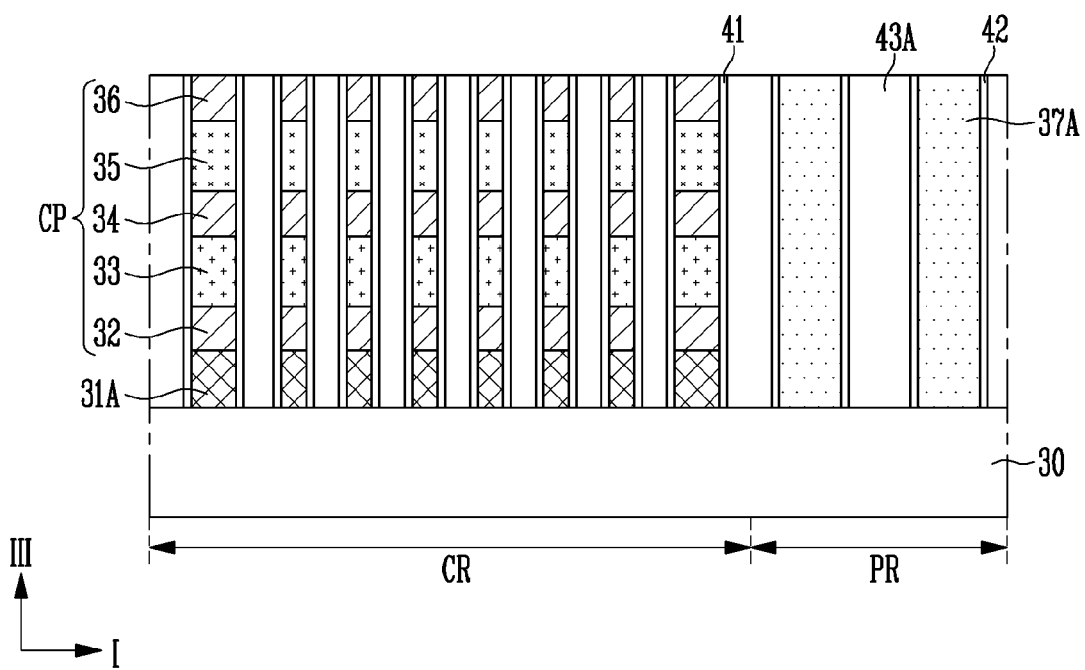

Referring to FIGS. 9A and 9B, an insulating layer 43A may be formed. The insulating material 43 may be planarized to form the insulating layer 43A. The planarizing process may be performed using a chemical mechanical polishing (CMP) method, or an etch-back method. The insulating material 43 may be etched until the upper surfaces of the cell patterns and the upper surface of the first dummy insulating pattern 37A are exposed, thereby forming the insulating layer 43A.

When the first dummy insulating patterns 37A are not formed, the peripheral region PR may not be coated with a sufficient amount of the insulating material 43. As a result, the cell patterns CP adjacent to the peripheral region PR may be exposed during the process of planarizing the insulating material 43. In addition, the exposed cell patterns CP may be damaged. On the other hand, when the first dummy insulating patterns 37A are provided, the peripheral region PR may be coated with a sufficient amount of the insulating material 43. As a result, the cell patterns CP may not be exposed when the insulating layer 43A is formed. Therefore, damage to the cell patterns CP may be prevented.

While FIGS. 3A to 9B show a perspective with plan views having an X-axis in the direction I and a Y-axis in the direction II and cross-sections in the plane of the directions I and III, FIGS. 10A to 12B show plan views having an X-axis in the direction II and a Y-axis in the direction I and cross-sections in the plane of directions II and III. Accordingly, while FIGS. 3A to 9B are in alignment with the perspective of FIG. 1 and illustrate the region occupied by the dummy patterns DP1 in FIG. 1, FIGS. 10A to 12B are shifted to illustrate the region occupied by the dummy patterns DP2.

Figure 10A:
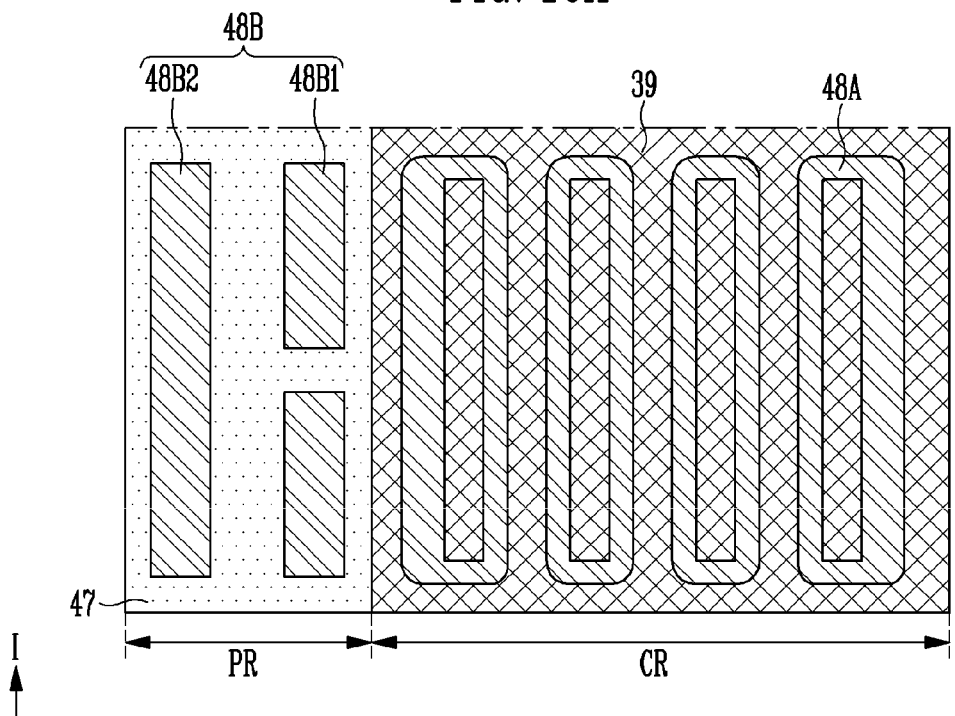
Figure 10B:
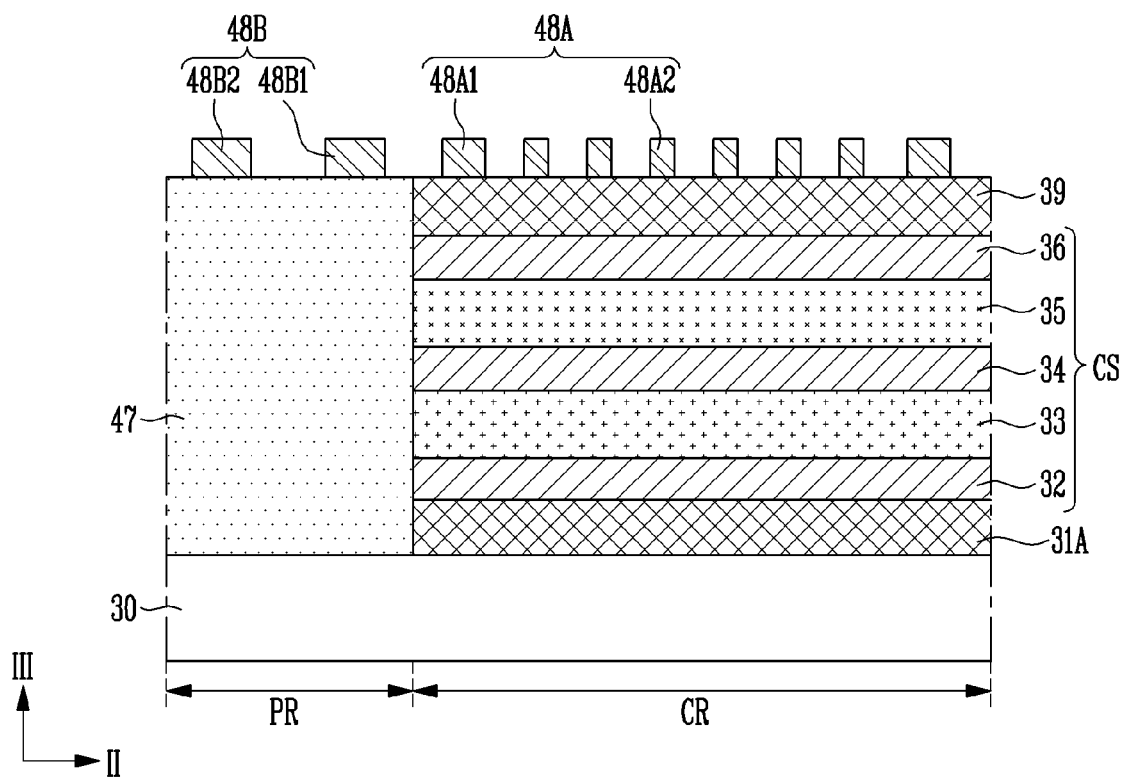

Referring to FIGS. 10A and 10B, a second conductive material 39 may be formed on the cell stack CS. After the second conductive material 39 is formed in the cell region CR and the peripheral region PR, a portion of the second conductive material 39 which is formed in the peripheral region PR may be etched. The second conductive material 39 may form a column line and may include metal such as tungsten.

Subsequently, an insulating layer 47 may be formed in the peripheral region PR. The insulating layer 47 may include an oxide layer. The insulating layer 47 may be a single layer or a multilayer film. A lower portion of the insulating layer 47 may be formed when the insulating material 43 is formed, so forming insulating layer 47 may include depositing an insulating material onto the insulating material 43. An upper surface of the insulating layer 47 may be located at a level that is substantially the same or similar to an upper surface of the second conductive material 39.

Subsequently, a third mask pattern 48A and a fourth mask pattern 48B may be formed. The third mask pattern 48A may be formed on the cell stack CS and the fourth mask pattern 48B may be formed on the insulating layer 47. After the third mask pattern 48A is formed, the fourth mask pattern 48B may be formed. However, in another embodiment, the third mask pattern 48A may be formed after the fourth mask pattern 48B is formed.

The third mask pattern 48A may cross the cell patterns CP and have a loop shape with a long axis that extends in the first direction I. A portion 48A1 of the third mask pattern 48A may have a greater width than a remaining portion 48A2 of the pattern. The third mask pattern 48A may be formed in a similar manner to the first mask pattern 38A as described above.

The fourth mask pattern 48B may extend in parallel with the third mask pattern 48A and have a greater width than the third mask pattern 48A. A portion 48B2 of the fourth mask pattern 48B which is located at the edge of peripheral region PR may have a greater length than portion 48B1 located inwards from the edge of the peripheral region PR. The fourth mask pattern 48B may be formed in a similar manner to the second mask pattern 38B as described above.

Figure 11A:
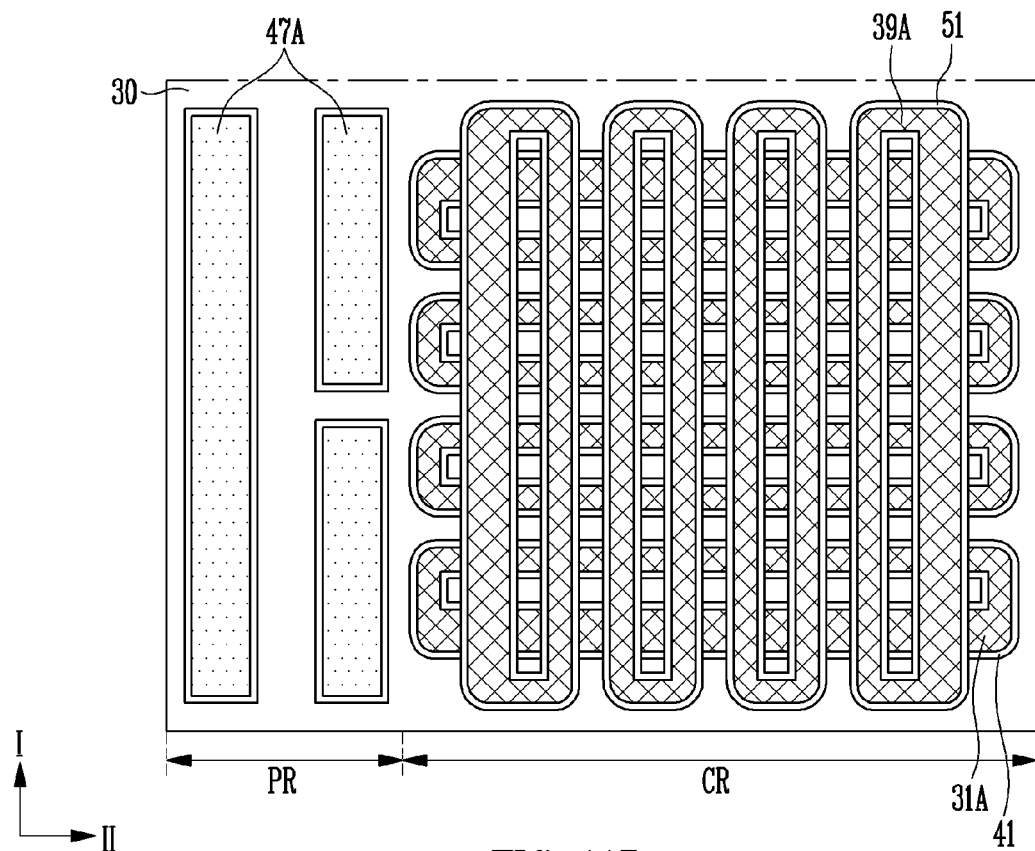
Figure 11B:
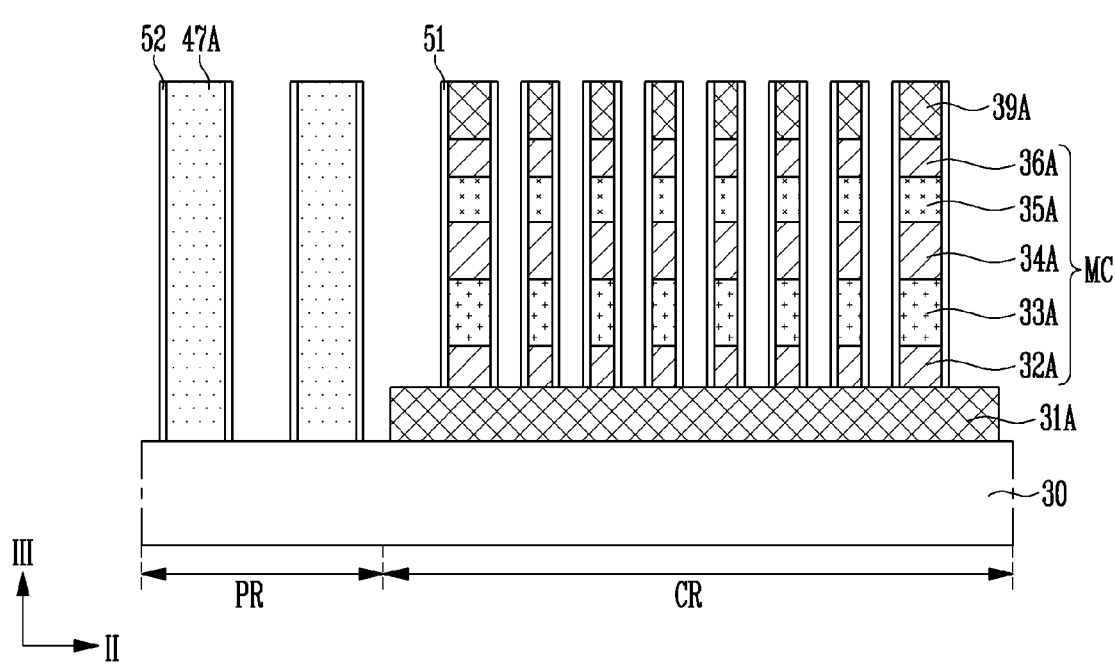

Referring to FIGS. 11A and 11B, column lines 39A, the memory cells MC and second dummy insulating patterns 47A may be formed. The column lines 39A may be formed by etching the second conductive material 39 using the third mask pattern 48A as an etch barrier. Each of the column lines 39A may have a loop shape. Subsequently, the memory cells MC may be formed by etching the cell patterns CP. The memory cells MC may be located at intersections between the column lines 39A and the row lines 31A. Each of the memory cells MC may include at least one of a first electrode 32A, a switching layer 33A, a second electrode 34A, a variable resistance layer 35A and a third electrode 36A.

In addition, referring to FIGS. 11A and 11B, the second dummy insulating patterns 47A may be formed by etching the insulating layer 47 using the fourth mask pattern 48B as an etch barrier. The second dummy insulating patterns 47A may be formed when the memory cells MC and the column lines 39A are formed. Upper surfaces of the column lines 39A and upper surfaces of the second dummy insulating patterns 47A may be located at substantially the same level.

Subsequently, second liner layers 51 and second dummy liner layers 52 may be formed. The second liner layers 51 may be formed on sidewalls of the memory cells MC. The second liner layers 51 may be formed on the entirety or a portion of the sidewalls of the memory cells MC and the column lines 39A. The second dummy liner layers 52 may be formed on sidewalls of the second dummy insulating patterns 47A. The second dummy liner layers 52 may be formed on the entirety or a portion of the sidewalls of the second dummy insulating patterns 47A.

The second dummy liner layers 52 may be formed when the second liner layers 51 are formed. Therefore, the structure and material of the second dummy liner layers 52 may be substantially the same as those of the second liner layers 51. The second liner layers 51 and the second dummy liner layers 52 may be formed using a deposition process so that a the liner layer material conforms to the profile of the memory cells MC and the second dummy insulating patterns 47A. The second liner layers 51 and the second dummy liner layers 52 may include a non-conductive material such as an oxide or a nitride material.

Figure 12A:
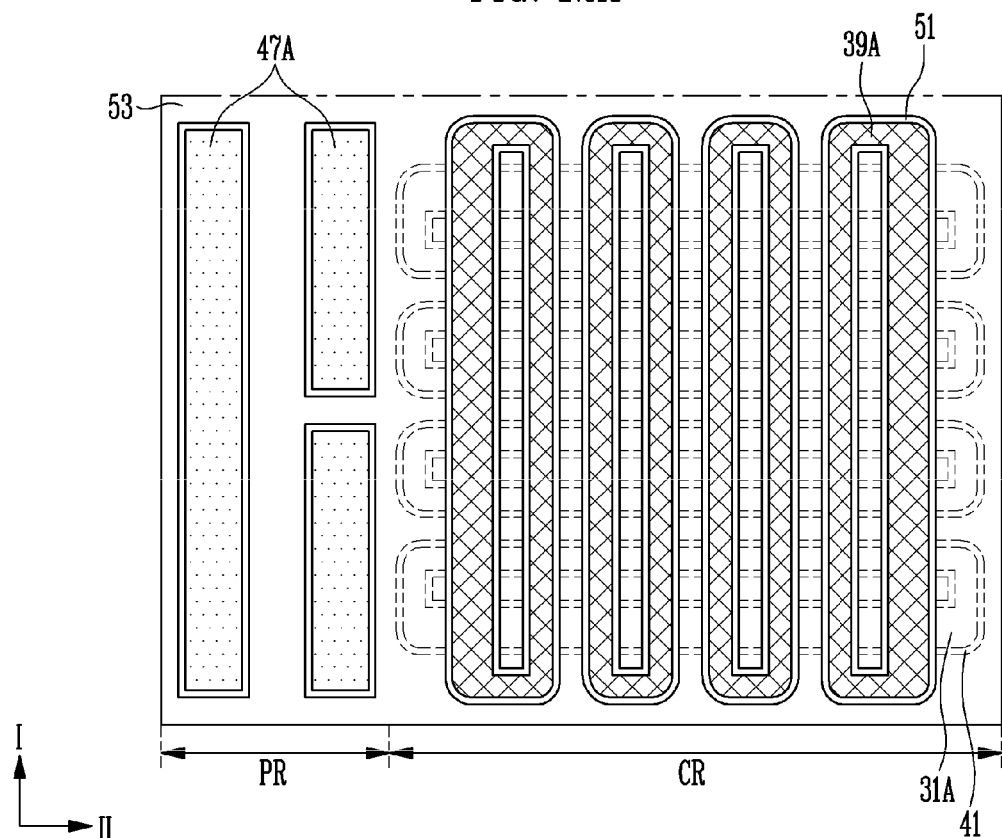
Figure 12B:
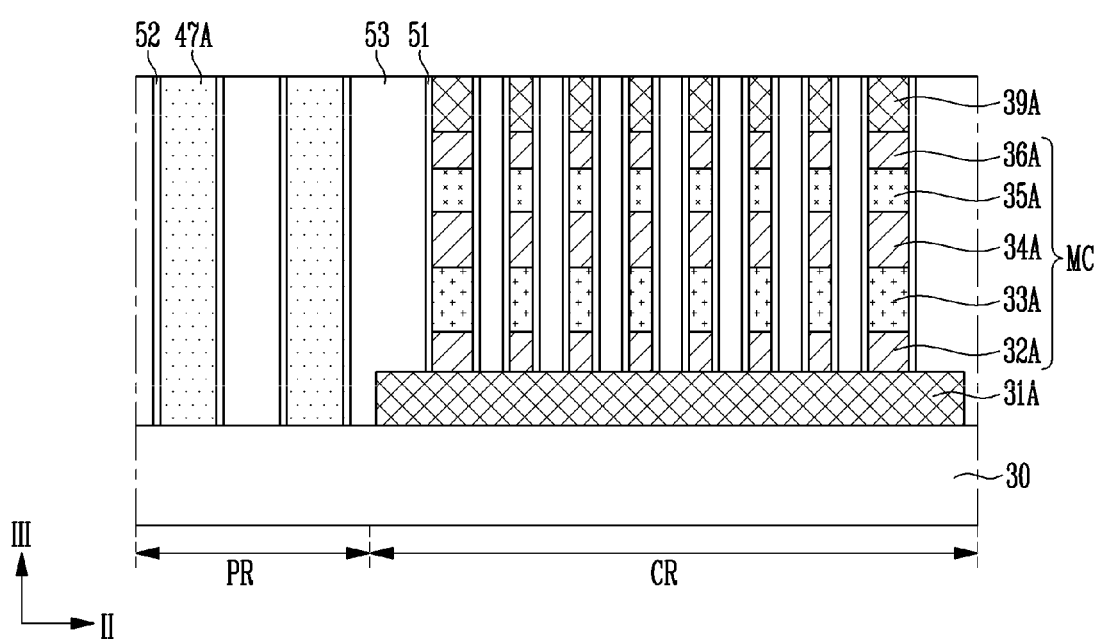

Referring to FIGS. 12A and 12B, an insulating layer 53 may be formed. The insulating layer 53 may fill spaces between the memory cells MC, spaces between the column lines 39A and spaces between the second dummy insulating patterns 47A.

The insulating layer 53 may be formed in a similar manner to the insulating layer 43A as described above. First, an insulating material may be formed to fill spaces between the memory cells MC, spaces between the column lines 39A and spaces between the second dummy insulating patterns 47A. Subsequently, the insulating material may be planarized to form the insulating layer 53. The second dummy insulating patterns 47A in the peripheral region PR may reduce or eliminate a level difference between the cell region CR and the peripheral region PR, and provide a sufficient amount of the insulating material in the peripheral region PR. Therefore, damage to the column lines 39A and the memory cells MC may be prevented.

Figure 13:
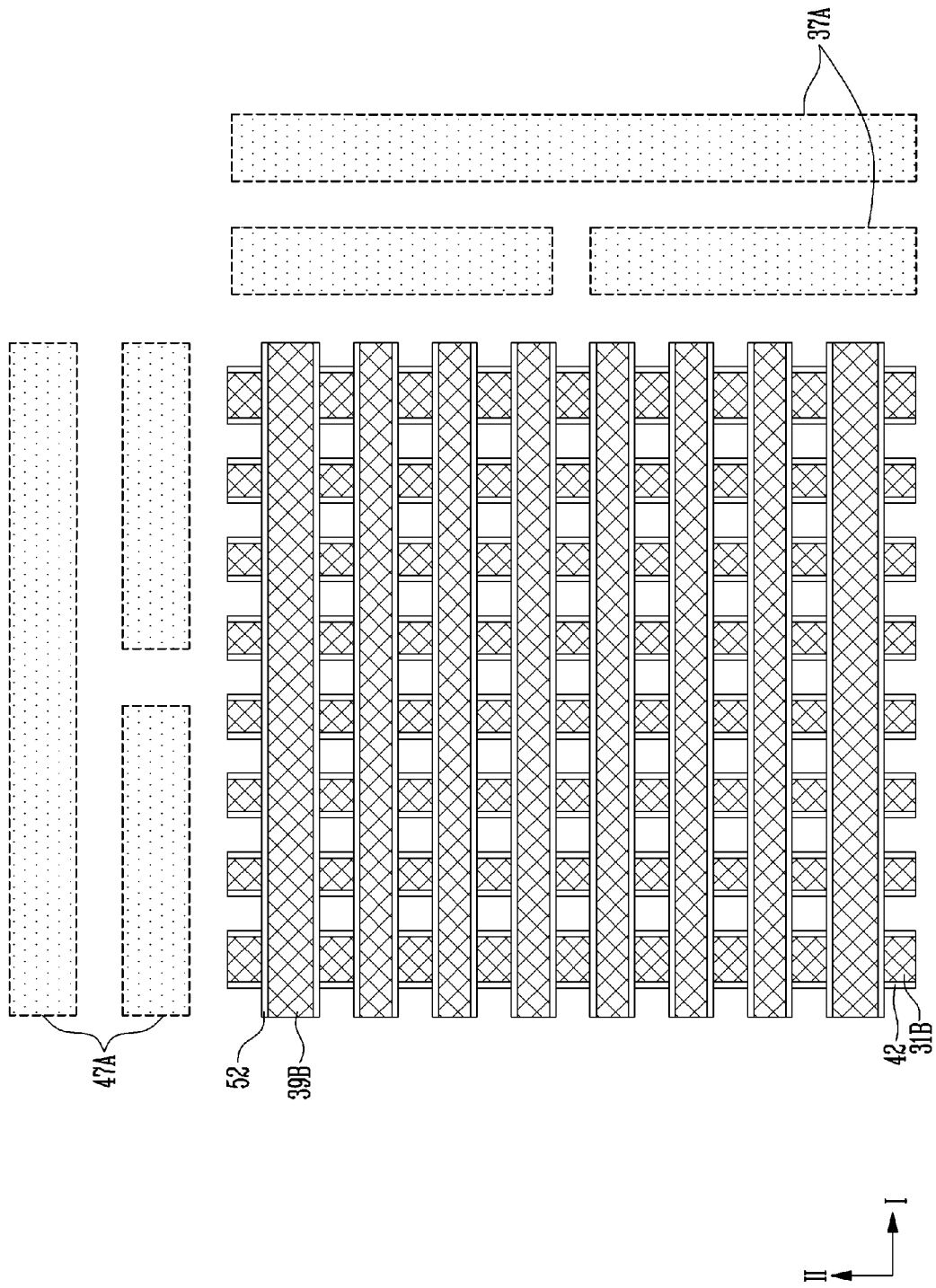

Referring to FIG. 13, ends of the row lines 31A and the column lines 39A may be etched. As a result, row lines 31B having a line shape and extending in the second direction II and column lines 39B having a line shape and extending in the first direction I may be formed.

In addition, at least one of the first dummy insulating patterns 37A, the first dummy liner layers 42, the second dummy insulating patterns 47A, and the second dummy liner layers 52 may be removed. For example, the process of etching ends of the row lines 31A and the column lines 39A may remove the first dummy insulating patterns 37A. However, in another embodiment, the dummy insulating patterns may be removed using a separate process.

According to the above-described manufacturing method, the first dummy insulating patterns 37A, the second dummy insulating patterns 47A, or a combination of the first and second dummy insulating patterns 37A and 47A may be formed in the peripheral region PR. The insulating layers 37 and 47 may be formed with a predetermined thickness in the peripheral region PR, and prevent exposure or damage of the cell pattern CP or the memory cell MC when the memory cells MC are being formed.

Figure 14:
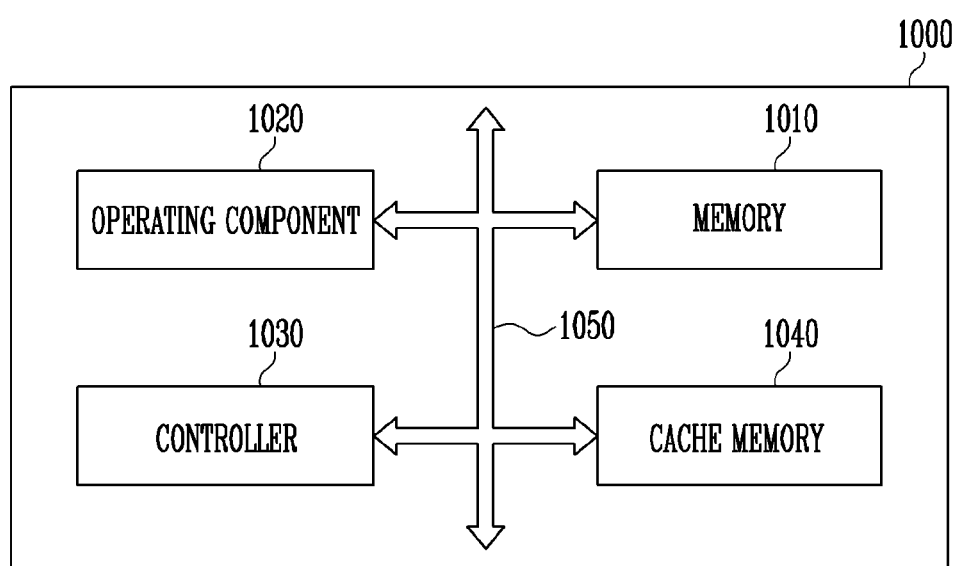
FIG. 14 is a diagram illustrating the configuration of a microprocessor implementing a memory device according to an embodiment of the present disclosure.

FIG. 14 is a diagram illustrating the configuration of a microprocessor 1000 implementing a memory device according to an embodiment of the present disclosure.

Referring to FIG. 14, the microprocessor 1000 may control and adjust a series of processes of receiving data from various types of external devices, processing the data and sending results to external devices. The microprocessor 1000 may include a memory 1010, an operation unit 1020, and a control unit 1030. The microprocessor 1000 may be various data processing units such as a central processing unit (CPU), a graphic processing unit (GPU), a digital signal processor (DSP) and an application processor (AP).

The memory 1010 may be a processor register or a register, and may store data in the microprocessor 1000. The memory 1010 may include various types of registers including a data register, an address register, and a floating point register. The memory 1010 may serve to temporarily store an address at which data on which an operation is performed, data corresponding to a result of the operation, and data for performing the operation are stored.

The memory 1010 may include at least one of the embodiments of the above-described semiconductor device. For example, the memory 1010 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. Therefore, read operation characteristics of the memory 1010 may be improved. As a result, read operation characteristics of the microprocessor 1000 may be improved.

The operation unit 1020 may perform various arithmetic operations or logical operations according to a result obtained by decoding an instruction by the control unit 1030. The operation unit 1020 may include at least one arithmetic and logic unit (ALU).

The control unit 1030 may receive signals from the memory 1010, the operation unit 1020 and the external devices of the microprocessor 1000, extract or decode a command, control the signal input and output of the microprocessor 1000, and execute processing represented by program.

According to the present disclosure, the microprocessor 1000 may further include a cache memory 1040 that may temporarily store data input from an external device in addition to the memory 1010, or data to be output to the external device. The cache memory 1040 may exchange data with the memory 1010, the operation unit 1020 and the control unit 1030 through a bus interface 1050.

Figure 15:
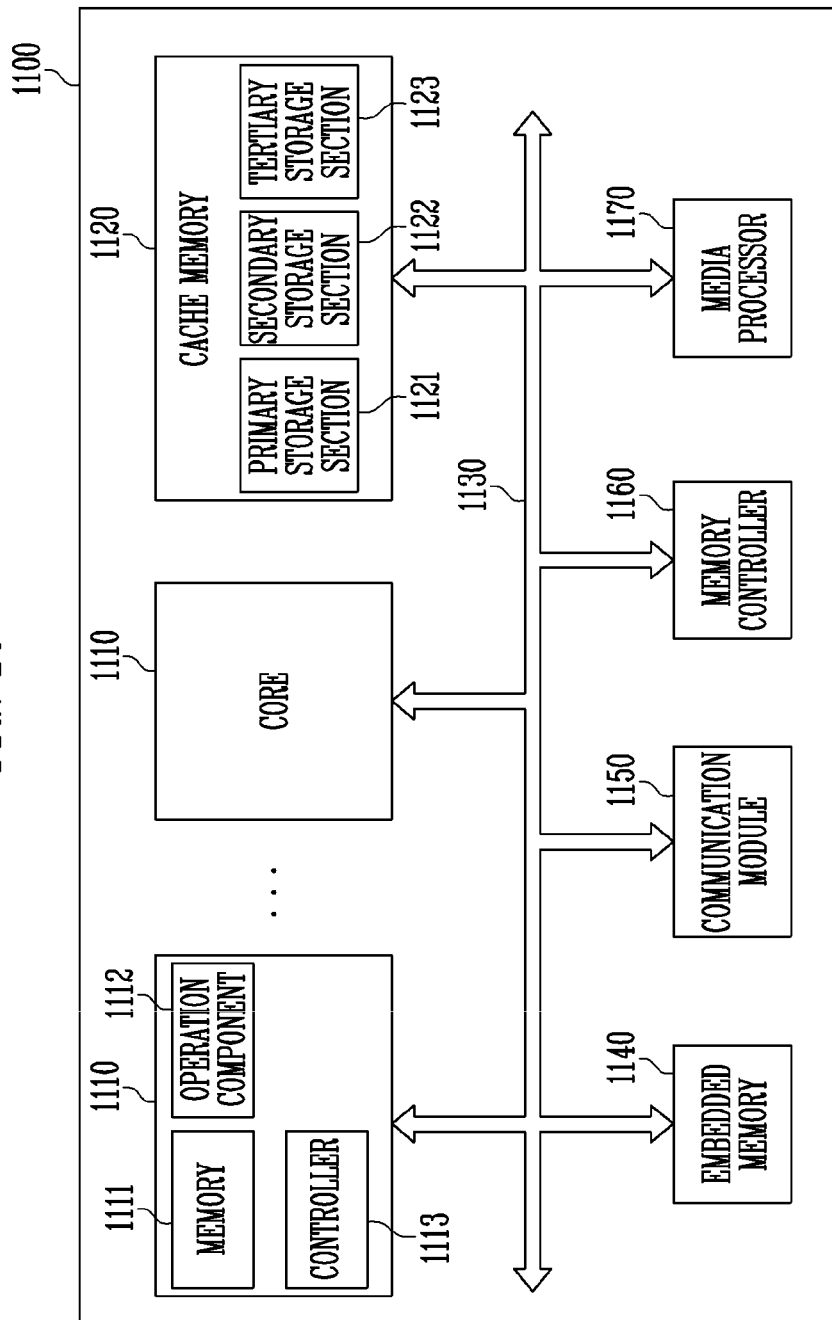
FIG. 15 is a diagram illustrating the configuration of a processor implementing a memory device according to an embodiment of the present disclosure.

FIG. 15 is a diagram illustrating the configuration of a processor 1100 implementing a memory device according to an embodiment of the present disclosure.

Referring to FIG. 15, the processor 1100 may improve performance and perform multiple functions in addition to the functions of a microprocessor controlling and adjusting a series of processes of receiving and processing data from various external devices and sending results thereof to the external devices. The processor 1100 may include a core 1110 serving as a microprocessor, a cache memory 1120 temporarily storing data, and a bus interface 1130 for data transfer between internal external devices. The processor 1100 may include various types of systems on chip (SoCs) such as a multi-core processor, a graphic processing unit (GPU), and an application processor (AP).

According to an embodiment of the present disclosure, the core 1110 may perform arithmetic and logic operations on the data input from the external device and may include a memory 1111, an operation unit 1112 and a control unit 1113.

The memory 1111 may be a processor register or a register, and may store data in the microprocessor 1100. The memory 1111 may include various types of registers including a data register, an address register, and a floating point register. The memory 1111 may serve to temporarily store an address at which data on which an operation is performed, data corresponding to a result of the operation, and data for performing the operation are stored. The operation unit 1112 may perform an operation in the processor 1100. More specifically, the operation unit 1112 may perform various fundamental arithmetic operations or logical operations according to a result of decoding an instruction. The operation unit 1112 may include at least one arithmetic and logic unit (ALU). The control unit 1113 may receive signals from the memory 1111, the operation unit 1112 and the external devices of the processor 1100, extract or decode a command, control signal input and output of the processor 1100, and execute processing represented by program.

The cache memory 1120 may temporarily store data so as to compensate for the difference in data processing speed between the core 1110 operating at a high speed and the external device operating at a low speed. The cache memory 1120 may include a primary storage section 1121, a secondary storage section 1122 and a tertiary storage section 1123. In general, the cache memory 1120 may include the primary and secondary storage sections 1121 and 1122. When high capacity is required, the cache memory 1120 may further include the tertiary storage section 1123. If necessary, the cache memory 1120 may include more storage sections. In other words, the number of storage sections included in the cache memory 1120 may vary depending on the design. The primary, secondary and tertiary storage sections 1121, 1122 and 1123 may have the same or different processing speeds for storing and determining data. When the respective storage sections have different processing speeds, the primary storage section 1121 may have the highest processing speed among the primary, secondary, and tertiary storage sections 1121, 1122 and 1123. At least one of the primary, secondary and tertiary storage sections 1121, 1122 and 1123 may include at least one of the embodiments of the above-described semiconductor device. For example, the cache memory 1120 may include column lines; row lines crossing the column lines; memory cells located at intersections between the column lines and the row lines, dummy insulating patterns located adjacent to the memory cells; liner layers formed on sidewalls of the memory cells; and dummy liner layers formed on sidewalls of the dummy insulating patterns. As a result, read operation characteristics of the cache memory 1120 may be improved. As a result, read operation characteristics of the processor 1100 may be improved.

As illustrated in FIG. 15, all of the primary, secondary and tertiary storage sections 1121, 1122 and 1123 may be included in the cache memory 1120. However, the primary, secondary and tertiary storage sections 1121, 1122 and 1123 of the cache memory 1120 may be provided outside the core 1110 to compensate for the difference in processing speeds of the core 1110 and the external device. Alternatively, the primary storage section 1121 of the cache memory 1120 may be located in the core 1110, and the secondary storage section 1122 and the tertiary storage section 1123 may be provided outside the core 1110 to enhance the function of supplementing the difference in data processing speed. However, the primary and secondary storage sections 1121 and 1122 may be located in the core 1110 and the tertiary storage section 1123 may be located outside the core 1110.

The bus interface 1130 may connect the core 1110, the cache memory 1120 and the external device so that data may be efficiently transferred.

According to an embodiment of the present disclosure, the processor 1100 may include a plurality of cores 1110 which may share the cache memory 1120. The plurality of cores 1110 and the cache memory 1120 may be directly coupled to each other, or may be coupled through the bus interface 1130. Each of the plurality of cores 1110 may have the same configuration as the above-described core. When the processor 1100 includes the plurality of cores 1110, the number of primary storage sections 1121 of the cache memory 1120 may correspond to the number of cores 1110. Each of the primary storage sections 1121 of the cache memory 1120 may be included in each of the cores 1110. In addition, the secondary storage section 1121 and the tertiary storage section 1123 may be provided outside the plurality of cores 1110 and shared through the bus interface 1130. The primary storage section 1121 may have a faster processing speed than the secondary and tertiary storage sections 1122 and 1123. In another embodiment, the number of primary storage sections 1121 and the number of secondary storage sections 1122 may correspond to the number of cores 1110. Each of the primary storage sections 1121 and each of the secondary storage sections 1122 may be included in each of the cores 1110. The tertiary storage section 1123 may be provided outside the plurality of cores 1110 and shared by the plurality of cores 1110 through the bus interface 1130.

According to an embodiment of the present disclosure, the processor 1100 may include an embedded memory 1140 storing data, a communication module unit 1150 wiredly or wirelessly transmitting or receiving the data to or from an external device, a memory control unit 1160 driving an external memory device, and a media processing unit 1170 processing or outputting data, processed by the processor 1100 or input from the external input device, to an external interface device. The processor 1100 may further include various modules and devices. The added modules may exchange data with each other and with the core 1110 and the cache memory 1120 through the bus interface 1130.

The embedded memory 1140 may include a non-volatile memory as well as a volatile memory. A volatile memory may include dynamic random access memory (DRAM), a Mobile DRAM, Static Random Access Memory (SRAM), and memory with similar functions. A non-volatile memory may include Read Only Memory (ROM), NOR Flash Memory, NAND Flash Memory, Phase Change Random Access Memory (PRAM), Resistive Random Access Memory (RRAM), Spin Transfer Torque Random Access Memory (STTRAM), Magnetic Random Access Memory (MRAM), and a memory with similar functions.

The communication module unit 1150 may include a module connected to a wired network, a module connected to a wireless network, or both. A wired network module may include a Local Area Network (LAN), a Universal Serial Bus (USB), an Ethernet, Power Line Communication (PLC), or the like, which transmits and receives data through a transmission line. A wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like, which transmits and receives data without a transmission line.

The memory control unit 1160 may include various controllers for processing and managing data transferred between the processor 1100 and an external storage device which operates according to a different communication standard from that of the processor 1100. For example, the memory control unit 1160 may include a controller controlling Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multimedia card (MMC), an embedded MMC (eMMC), a compact flash (CF) card, or the like.

The media processing unit 1170 may process data processed by the processor 1100, or data in the form of video or audio or in another form, which is input from an external input device, and may output the processed data to an external interface device. The media processing unit 1170 may include a Graphics Processing Unit (GPU), a Digital Signal Processor (DSP), a High Definition Audio (HD audio), a high definition multimedia interface (HDMI) controller, or the like.

Figure 16:
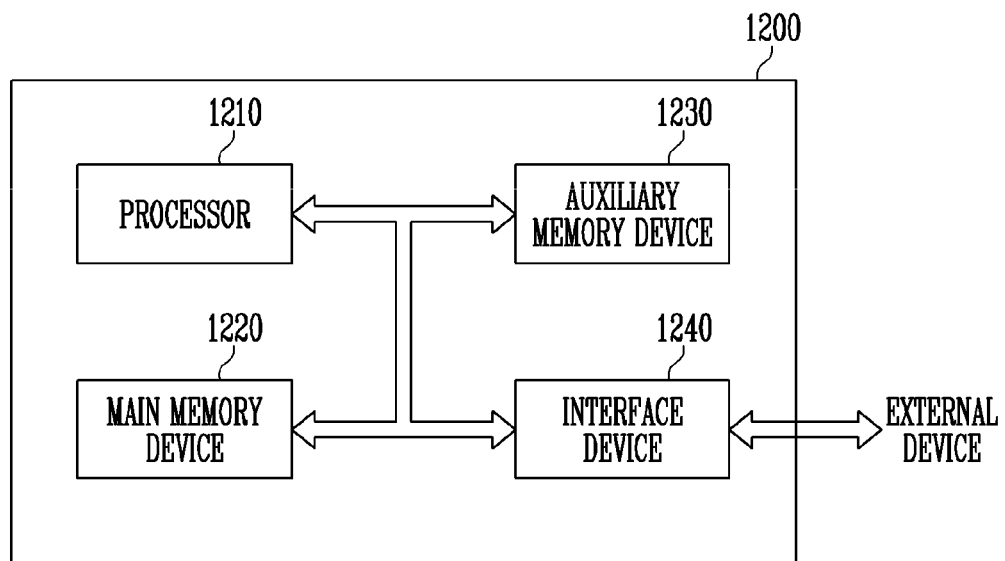
FIG. 16 is a diagram illustrating the configuration of a system implementing a memory device according to an embodiment of the present disclosure.

FIG. 16 is a diagram illustrating the configuration of a system 1200 implementing a memory device according to an embodiment of the present disclosure.

Referring to FIG. 16, the system 1200 may refer to a device configured to process data. To perform a series of manipulations for data, the system 1200 may perform inputting, processing, outputting, communicating, storing, and the like to perform a series of operations on data. The system 1200 may include a processor 1210, a main memory device 1220, an auxiliary memory device 1230, and an interface device 1240. According to an embodiment of the present disclosure, the system 1200 may be a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual (AV) system, or a smart television.

The processor 1210 may control the decoding of input commands and the processing of the data stored in the system 1200, such as operation and comparison of the data. The processor 1210 may include one or more of a microprocessor unit (MPU), a central processing unit (CPU), a single/multi-core processor, a graphic processing unit (GPU), an application processor (AP), a digital signal processor (DSP), and so on.

The main memory device 1220 may refer to a storage where program codes or material is moved from the auxiliary memory device 1230, and are stored and executed when program is executed. The stored data may be retained even in the absence of power supply. The main memory device 1220 may include at least one of the embodiments of the above-described semiconductor device. For example, the main memory device 1220 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. As a result, read operation characteristics of the main memory device 1220 may be improved. As a result, read operation characteristics of the system 1200 may be improved.

In addition, the main memory device 1220 may further include a non-volatile static random access memory (SRAM) or a non-volatile dynamic random access memory (DRAM) which retains all data when power supply is blocked. In another example, the main memory device 1220 may not include the semiconductor device according to the above-described embodiment and may include a volatile static random access memory (SRAM) or a volatile dynamic random access memory (DRAM) which loses all data when power supply is blocked.

The auxiliary memory device 1230 may refer to a memory device designed to store program codes or data. Although the auxiliary memory device 1230 is slower than the main memory device 1220, the auxiliary memory device 1230 may store more data than the main memory device 1220. The auxiliary memory device 1230 may include at least one of the embodiments of the above-described semiconductor device. For example, the auxiliary memory device 1230 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. As a result, read operation characteristics of the auxiliary memory device 1230 may be improved. As a result, read operation characteristics of the system 1200 may be improved.

Figure 17:
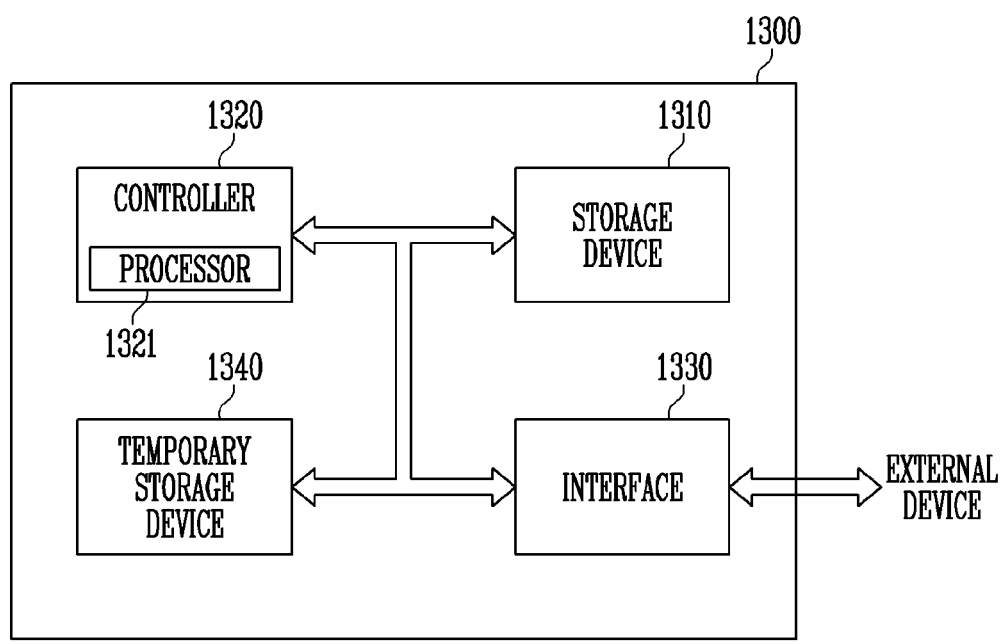
FIG. 17 is a diagram illustrating the configuration of a data storage system implementing a memory device according to an embodiment of the present disclosure.

In addition, the auxiliary memory device 1230 may further include a data storage system 1300 as shown in FIG. 17, such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on. However, in contrast thereto, the auxiliary memory device 1230 may not include the semiconductor device according to the above-described embodiment and may further include the data storage system 1300 as shown in FIG. 17, such as a magnetic tape using magnetism, a magnetic disk, a laser disk using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this embodiment and an external device. The interface device 1240 may be a keypad, a keyboard, a mouse, a speaker, a microphone, a display, various human interface devices (HIDs), a communication device, and so on. The communication device may include either or both a module connected to a wired network and a module connected to a wireless network. The wired network module may include a Local Area Network (LAN), a Universal Serial Bus (USB), an Ethernet, Power Line Communication (PLC) in the same manner as in various devices which transmit and receive data through transmission lines. The wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like in the same manner as in various devices which transmit and receive data without a transmission line.

FIG. 17 is a diagram illustrating the configuration of the data storage system 1300 implementing a memory device according to an embodiment of the present disclosure.

Referring to FIG. 17, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), and a solid state disk (SSD), and a card type such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card.

The storage device 1310 may include a non-volatile memory which stores data semi-permanently. The non-volatile memory may include a read only memory (ROM), a NOR flash memory, a NAND flash memory, a phase change random access memory (PRAM), a resistive random access memory (RRAM), and a magnetic random access memory (MRAM).

The controller 1320 may control data exchange between the storage device 1310 and the interface 1330. The controller 1320 may include a processor 1321 for performing an operation for processing commands input through the interface 1330 from an external device of the data storage system 1300.

The interface 1330 may be provided to exchange commands and data between external devices. In the case where the data storage system 1300 is a card type device, the interface 1330 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. In the case where the data storage system 1300 is a disk type device, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal, serial bus), and the like. The interface 1300 may be compatible with interfaces which are similar to these interfaces. The interface 1330 may be compatible with one or more interfaces having different types.

The temporary storage device 1340 may store data temporarily for efficiently transferring data between the interface 1330 and the storage device 1310 according to diversifications and high performance of an interface with an external device, a controller and a system. The temporary storage device 1340 may include at least one of the embodiments of the above-described semiconductor device. For example, the temporary storage device 1340 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. Therefore, read operation characteristics of the temporary storage device 1340 may be improved. As a result, read operation characteristics of the data storage system 1300 may be improved.

Figure 18:
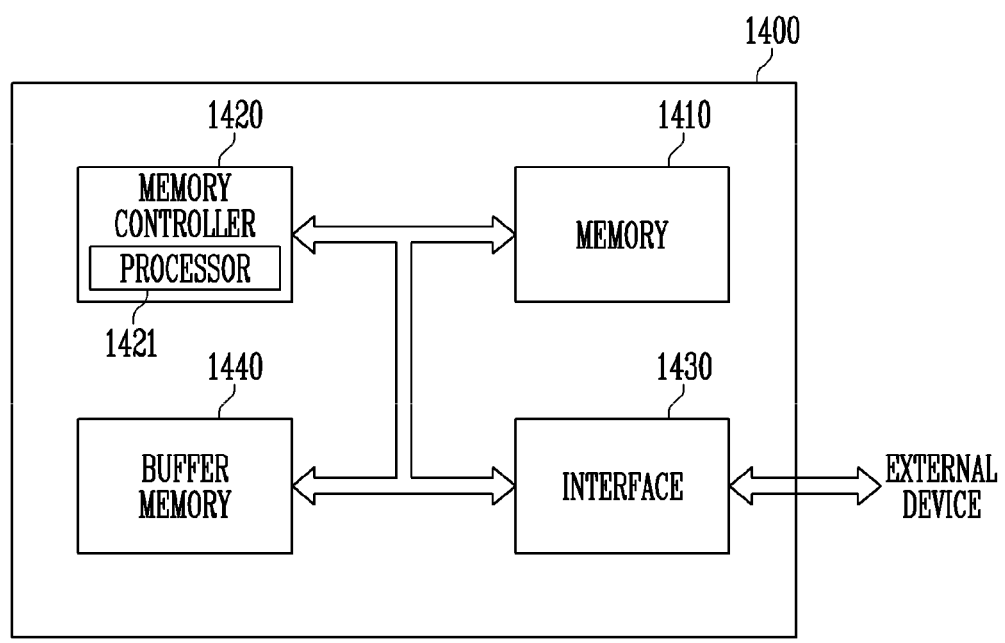
FIG. 18 is a diagram illustrating the configuration of a memory system implementing a memory device according to an embodiment of the present disclosure.

FIG. 18 is a diagram illustrating the configuration of a memory system 1400 implementing a memory device according to an embodiment of the present disclosure.

Referring to FIG. 18, the memory system 1400 may include a memory 1410 which has a nonvolatile characteristic as a component for storing data, a memory controller 1420 which controls the memory 1410, and an interface 1430 for connection with an external device. The memory system 1400 may be a card type device such as a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

The memory 1410 storing data may include at least one of the embodiments of the above-described semiconductor device. For example, the memory 1410 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. Thus, read operation characteristics of the memory 1410 may be improved. As a result, read operation characteristics of the memory system 1400 may be improved.

The memory according to this embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. The memory controller 1420 may include a processor 1421 for performing an operation for processing commands input through the interface 1430 from an external device of the memory system 1400.

The interface 1430 may be provided to exchange commands and data between the memory system 1400 and the external device. The interface 1430 may be compatible with interfaces which are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces which are used in devices similar to the above-mentioned devices. The interface 1430 may be compatible with one or more interfaces having different types.

According to this embodiment, the memory system 1400 may further include a buffer memory 1440 for efficient transfer of data input and output between the interface 1430 and the memory 1410 according to diversification and high performance of an interface with an external device, a memory controller and a memory system. The buffer memory 1440 temporarily storing data may include at least one of the embodiments of the above-described semiconductor device. For example, the buffer memory 1440 may include column lines; row lines crossing the column lines; memory cells located at intersections between the column lines and the row lines; dummy insulating patterns located adjacent to the memory cells; liner layers formed on sidewalls of the memory cells; and dummy liner layers formed on sidewalls of the dummy insulating patterns. As a result, read operation characteristics of the memory system 1400 may be improved.

In addition, according to this embodiment, the buffer memory 1440 may further include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic. However, contrary thereto, the buffer memory 1440 may not include the semiconductor device according to the above-described embodiment and may further include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic.

Operating characteristics and reliability of an electronic device may be improved.

While the exemplary embodiments of the present disclosure have been disclosed for illustrative purposes, those skilled in the art will appreciate that various modifications, additions and substitutions are possible. Thus, it is intended that the present invention cover all such modifications provided they come within the scope of the appended claims and their equivalents.

What is claimed is:

1. A method of manufacturing an electronic device including a semiconductor memory, the method comprising:
    forming a cell stack in a cell region of a base;
    forming a first insulating layer in a peripheral region of the base;
    forming cell patterns by patterning the cell stack;
    forming first dummy insulating patterns by patterning the first insulating layer;
    forming liner layers on sidewalls of the cell patterns; and
    forming dummy liner layers on sidewalls of the first dummy insulating patterns.

2. The method of claim 1, wherein the first dummy insulating patterns are formed when the cell patterns are formed.

3. The method of claim 1, wherein the dummy liner layers are formed when the liner layers are formed.

4. The method of claim 1, wherein forming the cell patterns comprises:
    forming a hard mask layer on the cell stack and the first insulating layer;
    forming a first mask pattern on the cell stack by etching the hard mask layer; and
    etching the cell stack using the first mask pattern as an etch barrier.

5. The method of claim 4, wherein forming the first dummy insulating patterns comprises:
    forming a second mask pattern on the first insulating layer by etching the hard mask layer; and
    etching the first insulating layer using the second mask pattern as an etch barrier.

6. The method of claim 1, further comprising:
    forming an insulating material to fill a space between the cell patterns and a space between the first dummy insulating patterns; and
    planarizing the insulating material.

7. The method of claim 6, wherein forming the insulating material comprises coating a low-k material using a spin-on coating process.

8. The method of claim 6, wherein planarizing the insulating material comprises planarizing the insulating material until upper surfaces of the cell patterns and the first dummy insulating patterns are exposed.

9. The method of claim 1, wherein forming the cell stack comprises:
    forming a stacked structure including an electrode material and a variable resistance material on the base including the cell region and the peripheral region; and
    etching a portion of the stacked structure at a position corresponding to the peripheral region.

10. The method of claim 1, further comprising:
    forming a first conductive material before forming the cell stack; and
    forming row lines by etching the first conductive material after forming the cell patterns.

11. The method of claim 10, further comprising:
    forming a second conductive material on the cell patterns;
    forming column lines by etching the second conductive material; and
    forming memory cells by etching the cell patterns.

12. The method of claim 11, further comprising:
    forming a second insulating layer in the peripheral region of the base; and
    forming second dummy insulating patterns by etching the second insulating layer when the column lines and the memory cells are formed.

13. The method of claim 12, further comprising:
    forming an insulating material to fill a space between the memory cells and a space between the second dummy insulating patterns; and
    planarizing the insulating material.

14. The method of claim 13, wherein forming the insulating material comprises coating a low-k material using a spin-on coating process.

15. The method of claim 14, wherein planarizing the insulating material comprises planarizing the insulating material until upper surfaces of the column lines and the second dummy insulating patterns are exposed.

* * * * *